(12) United States Patent
Chung et al.

(10) Patent No.: US 8,356,227 B2
(45) Date of Patent: Jan. 15, 2013

(54) METHOD OF ENCODING/DECODING USING LOW DENSITY CHECK CODE MATRIX

(75) Inventors: Ji Wook Chung, Gyeonggi-do (KR); Min Seok Oh, Gyeonggi-do (KR); Ki Hyoung Cho, Gyeonggi-do (KR); Ji Ae Seok, Gyeonggi-do (KR); Young Seob Lee, Gyeonggi-do (KR); So Yeon Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 786 days.

(21) Appl. No.: 12/304,992

(22) PCT Filed: Jun. 15, 2007

(86) PCT No.: PCT/KR2007/002921
§ 371 (c)(1),
(2), (4) Date: Jul. 6, 2009

(87) PCT Pub. No.: WO2007/145487
PCT Pub. Date: Dec. 21, 2007

(65) Prior Publication Data
US 2009/0313520 A1    Dec. 17, 2009

(30) Foreign Application Priority Data

Jun. 16, 2006   (KR) .................. 10-2006-0054468

(51) Int. Cl.
*G06F 11/00* (2006.01)
(52) U.S. Cl. ........................................ 714/749
(58) Field of Classification Search .................. 714/749
See application file for complete search history.

(56) References Cited

U.S. PATENT DOCUMENTS

| | | | |
|---|---|---|---|
| 6,704,898 B1 * | 3/2004 | Furuskar et al. | 714/751 |
| 7,894,330 B2 * | 2/2011 | Lee et al. | 370/208 |
| 7,930,622 B2 * | 4/2011 | Oh et al. | 714/801 |
| 2003/0103585 A1 * | 6/2003 | Kim et al. | 375/340 |
| 2004/0098659 A1 | 5/2004 | Bjerke et al. | |
| 2004/0123229 A1 | 6/2004 | Kim et al. | |

FOREIGN PATENT DOCUMENTS

CN    1739244    2/2006

(Continued)

OTHER PUBLICATIONS

Brian Glasson et al., "Low-complexity LDPC coding for OFDMA PHY", IEEE 802.16 Broadband Wireless Access Working Group, IEEE C802.16e-04/101r0, May 2004, XP-002463827.

(Continued)

*Primary Examiner* — Bryce Bonzo
(74) *Attorney, Agent, or Firm* — Lee, Hong, Degerman, Kang & Waimey

(57) ABSTRACT

A method of encoding data using a parity check matrix, a method of decoding encoded data, and a data retransmission method using the same are disclosed. A data retransmission method in a communication system includes transmitting a codeword encoded by a first parity check matrix corresponding to a first coding rate, among at least two parity check matrixes corresponding to different coding rates, receiving NACK from the receiver in response to the codeword, and transmitting parity bits encoded by some of the second parity check matrix corresponding to a second coding rate, among the at least two parity check matrixes, to the receiver.

20 Claims, 41 Drawing Sheets

FOREIGN PATENT DOCUMENTS

| | | |
|---|---|---|
| EP | 1524771 | 4/2005 |
| WO | 2006011744 | 2/2006 |

OTHER PUBLICATIONS

Ajay Dholakia et al., "Rate-Compatible Low-Density Parity-Check Codes for Digital Subscriber Lines", IEEE Communications Society, Jun. 2004, XP-010710380.

Stefania Sesia et al., "Incremental Redundancy Hybrid ARQ Schemes Based on Low-Density Parity-Check Codes", IEEE Transactions on Communications, vol. 52, No. 8, Aug. 2004, XP-011118067.

* cited by examiner

FIG. 7

$$H = \begin{bmatrix} P^{h^b_{00}} & P^{h^b_{01}} & P^{h^b_{02}} & \cdots & P^{h^b_{0\,nb}} \\ P^{h^b_{10}} & P^{h^b_{11}} & P^{h^b_{12}} & \cdots & P^{h^b_{1\,nb}} \\ \cdots & \cdots & \cdots & \cdots & \cdots \\ P^{h^b_{mb\,0}} & P^{h^b_{mb\,1}} & P^{h^b_{mb\,2}} & \cdots & P^{h^b_{mb\,nb}} \end{bmatrix} = P^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

| | z_1 | z_2 | z_3 | z_4 | z_5 | z_6 | z_7 | z_8 | z_9 | z_10 | |
|---|---|---|---|---|---|---|---|---|---|---|---|
| 0 | 0 | z_11 | z_12 | z_13 | z_14 | z_15 | z_16 | z_17 | z_18 | z_19 | |
| 0 | 0 | 0 | z_20 | z_21 | z_22 | z_23 | z_24 | z_25 | z_26 | z_27 | |
| −1 | 0 | 0 | 0 | z_28 | z_29 | z_30 | z_31 | z_32 | z_33 | z_34 | |
| −1 | −1 | 0 | 0 | 0 | z_35 | z_36 | z_37 | z_38 | z_39 | z_40 | $H_p$-part |
| −1 | −1 | −1 | 0 | 0 | 0 | z_41 | z_42 | z_43 | z_44 | z_45 | |
| −1 | −1 | −1 | −1 | 0 | 0 | 0 | z_46 | z_47 | z_48 | z_49 | |
| −1 | −1 | −1 | −1 | −1 | 0 | 0 | 0 | z_50 | z_51 | z_52 | |
| −1 | −1 | −1 | −1 | −1 | −1 | 0 | 0 | 0 | z_53 | z_54 | |
| −1 | −1 | −1 | −1 | −1 | −1 | −1 | 0 | 0 | 0 | z_55 | |
| −1 | −1 | −1 | −1 | −1 | −1 | −1 | −1 | 0 | 0 | 0 | |
| y_1 | −1 | −1 | −1 | −1 | −1 | −1 | −1 | −1 | 0 | 0 | |

$H_d$-part

Accumulator Structure

| 0 | 1 | 0 | 1 | 1 | 0 | 0 | 0 |
|---|---|---|---|---|---|---|---|
| 1 | 0 | 1 | 0 | 1 | 1 | 0 | 0 |
| 0 | 1 | 0 | 0 | 0 | 1 | 1 | 0 |
| 1 | 0 | 1 | 1 | 0 | 0 | 1 | 1 |

Parity Check Matrix H $\times$ codeword c: $a_0, a_1, a_2, a_3, p_0, p_1, p_2, p_3$ $=$ $0, 0, 0, 0$ $a_1 \oplus a_3 \oplus p_0 = 0$ $a_0 \oplus a_2 \oplus p_0 \oplus p_1 = 0$ $a_1 \oplus p_1 \oplus p_2 = 0$ $a_0 \oplus a_2 \oplus a_3 \oplus p_2 \oplus p_3 = 0$ $p_0 = a_1 \oplus a_3$ $p_1 = a_0 \oplus a_2 \oplus p_0$ $p_2 = a_1 \oplus p_1$ $p_3 = a_0 \oplus a_2 \oplus a_3 \oplus p_2$

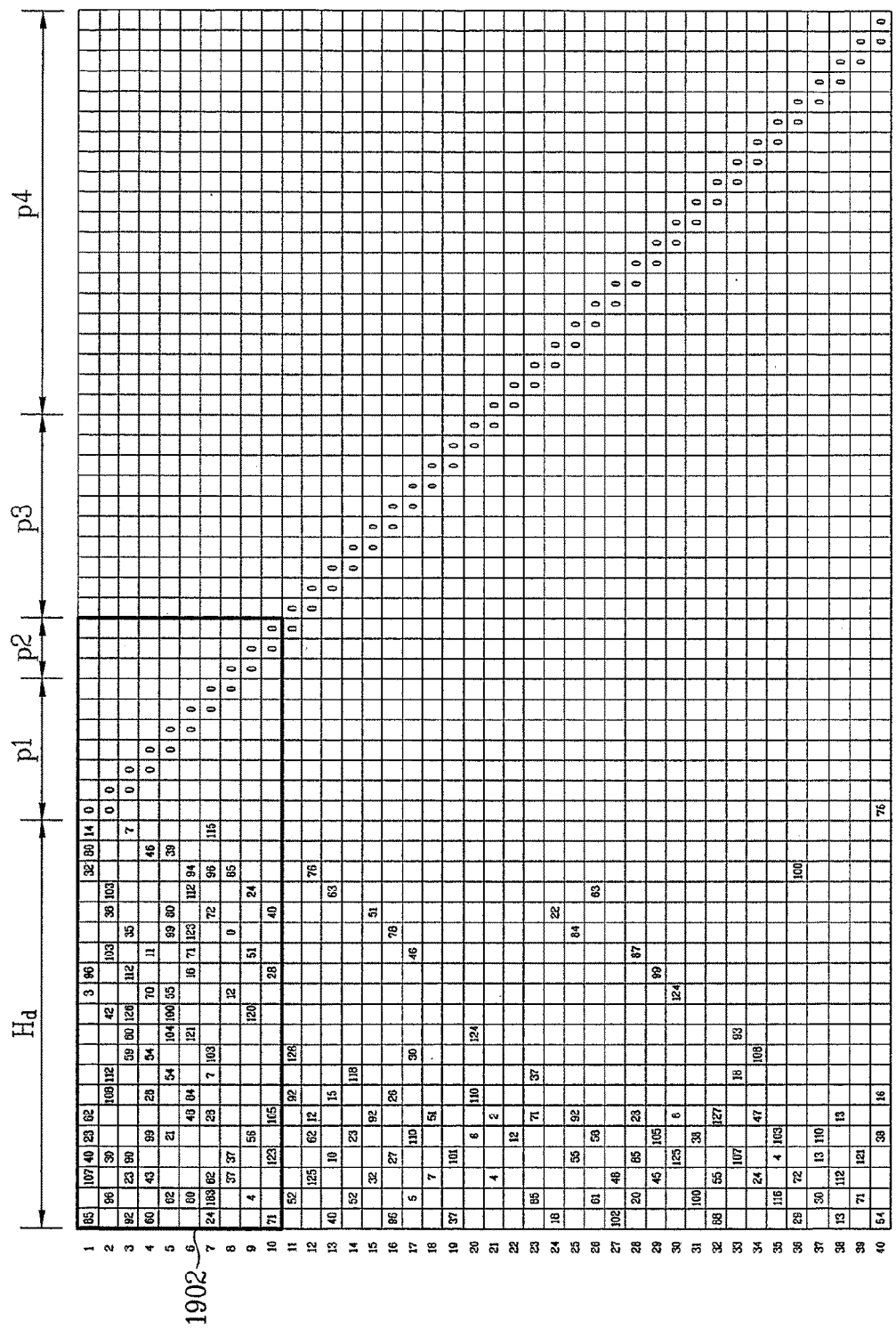

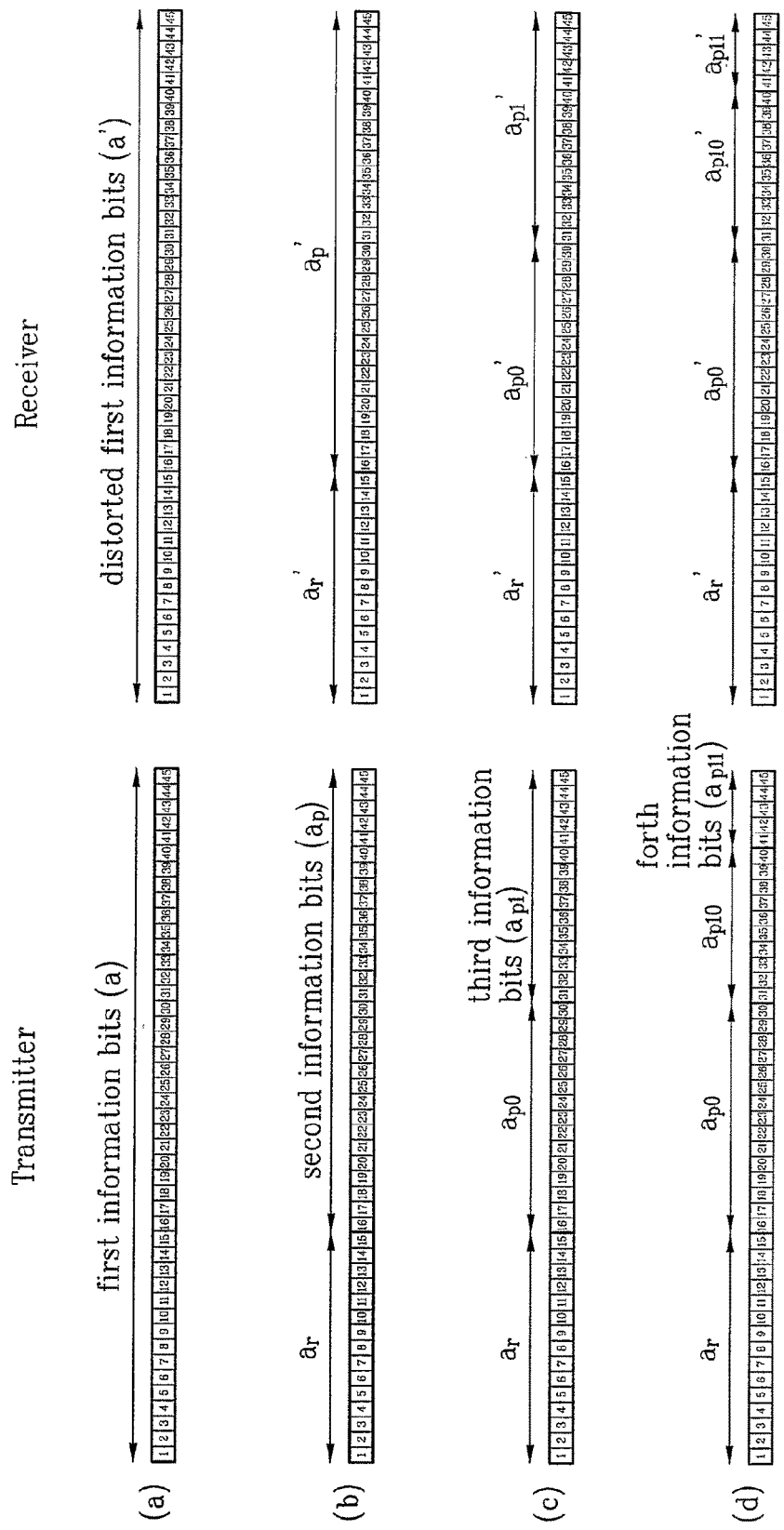

METHOD OF ENCODING/DECODING USING LOW DENSITY CHECK CODE MATRIX

CROSS-REFERENCE TO RELATED APPLICATIONS

This application is the National Stage filing under 35 U.S.C. §371 of International Application No. PCT/KR2007/002921, filed on Jun. 15, 2007, which claims the benefit of earlier filing date and right of priority to Korean Application No. 10-2006-0054468, filed on Jun. 16, 2006.

TECHNICAL FIELD

The present invention relates to a method of encoding/decoding using a low density parity check (LDPC), and more particularly, to a method of encoding data using a parity check matrix, a method of decoding encoded data, and a data retransmission method using the same.

BACKGROUND ART

FIG. 1 illustrates a structure of a mobile communication channel to which the present invention and the related art are applied. Hereinafter, the structure of the mobile communication channel will be described with reference to FIG. 1. A transmitter undergoes a channel coding procedure to transmit data without loss or distortion through a radio channel. Examples of the channel coding include convolutional coding, turbo coding, LDPC coding, etc. The data which has undergone the channel coding procedure can be transmitted to the radio channel as a single symbol which includes several bits. At this time, a procedure of mapping several bits to a single symbol is referred to as modulation.

The modulated data is converted into a signal for multiple transmission through a multiplexing procedure or a multiple access method. Examples of the multiplexing procedure include CDM, TDM, FDM, etc. An example of OFDM (Orthogonal Frequency Division Multiplexing) is shown in FIG. 1. The signal which has undergone the multiplexing block is changed to a structure suitable for transmission to one or more multi-antennas, and then is transferred to a receiver through the radio channel. Fading and thermal noise occur in the transmitted data when the data passes through the radio channel. For this reason, distortion may occur in the data.

The modulated data is transferred to the receiver through the radio channel. In this case, fading and thermal noise occur in the transmitted data, whereby distortion may occur therein. The receiver performs a series of procedures of the transmitter in reverse order after receiving the distorted data. The receiver performs demodulation to convert the data mapped to the symbol into a bit stream, undergoes channel decoding, and restores the distorted data to the original data.

An apparatus of performing the channel coding stores a matrix H or a matrix G, wherein the matrix H is a parity check matrix used to generate parity bits to be added to input data (systematic bits), and the matrix G is a parity check generate matrix derived from the matrix H. In other words, the transmitter includes an encoder which generates parity bits through the input data and the matrix H or G. An apparatus of performing channel decoding checks whether the systematic bits are restored well, through operation of the received data (distorted systematic bits+parity bits) with the matrix H, and performs operation again if the systematic bits are failed to be restored.

Examples of the modulation include BPSK (Binary Phase Shift Keying), QPSK (Quadrature Phase Shift Keying), 16-QAM (Quadrature Amplitude Modulation), 64-QAM, 256-QAM, etc. For example, 16-QAM maps the data stream which has undergone channel encoding to a single symbol in a unit of 4 bits during modulation. 16-QAM demaps the single symbol received through the radio channel four bits during demodulation.

Hereinafter, a data retransmission method that can be used along with the present invention will be described. There are provided various examples of the data retransmission method. Of them, HARQ (Hybrid Automatic Repeat reQuest) method will be described. The HARQ scheme is obtained by combination of FEC (Forward Error Correction) symbol and ARQ (Automatic Repeat reQuest) which is a retransmission method in a mobile communication system. According to the ARQ method, if error is detected from data received by the receiver, the receiver requests retransmission to a transmitter. Examples of the ARQ method include Stop-And-Wait, Selective Repeat, Go-Back-N, etc. depending on the retransmission method. According to the Stop-And-Wait method, as shown in FIG. 2, if the transmitter receives an acknowledgement (ACK) message from the receiver after transmitting data, the transmitter transmits next data, wherein ACK message notifies that the receiver has successfully received the data. If the transmitter receives a NACK message from the receiver, wherein NACK message notifies that the receiver has failed to successfully receive the data, the transmitter retransmits the failed data.

Meanwhile, according to the Go-Back-N method, the transmitter first transmits N number of data and receives ACK messages from the receiver in due order. FIG. 3 illustrates a case of N=7, wherein the number N of data which are transmitted without ACK message is referred to as a window size. If the transmitter receives NACK message in response to the kth data, the transmitter sequentially transmits data starting from the kth data.

FIG. 4 illustrates a Selective Repeat method. According to the Selective Repeat method, like the Go-Back-N method, the number N of data which are transmitted without ACK or NACK message is referred to as a window size, and retransmission is selectively performed for only data with NACK message.

According to the aforementioned HARQ scheme, if retransmission is performed in the ARQ method, previously transmitted data is combined with retransmitted data to restore the data through FEC symbol. The HARQ scheme is classified into a chase combining method and an incremental redundancy method depending on a combining method of the two data. According to the chase combining method, as shown in FIG. 5, the receiver combines transmission data with retransmission data to increase a receiving signal to noise ratio (SNR), thereby increasing a receiving success ratio of data at the receiver.

Meanwhile, unlike the chase combining method, the incremental redundancy method (hereinafter, referred to as 'IR method') transmits some of encoded data, which have not been used for first transmission, during retransmission of the transmitter to decrease a coding rate of data received at the receiver, thereby increasing a receiving success ratio.

Hereinafter, LDPC coding will be described. A concept of LDPC coding is as follows.

A linear code can be described with the parity check generation matrix G and the parity check matrix H. A characteristic of the linear code is that the equation of $Hc^T=0$ is satisfied for every bit of a codeword 'c'. As one of the linear code, the LDPC code which is recently paid attention to was proposed by Gallager in 1962 for the first time. One of the characteristics of the LDPC coding is that most of elements of the parity check matrix H are '0' and the number of elements which are not '0' is small compared to the codeword, so that repetitive decoding based on probability is possible. A parity check matrix H for the first proposed LDPC code was defined in a non-systematic form and each row and column of the parity check matrix were designed to equally have a small weight.

In this case, the weight means the number of '1' included in each row and column.

The LDPC coding scheme has low decoding complexity since a density of elements which are not '0' in the parity check matrix H is low. Further, decoding performance of the LDPC coding is superior to other coding schemes, which is adjacent to the theoretical limit of Shannon. However, the LDPC coding scheme could not be implemented with the hardware technique at the time of proposal by Gallegar, so that the LDPC coding scheme has not been paid attention to by the people for 30 years. A repetitive decoding scheme using graphs was developed in early 1980's and a couple of decoding algorithms for the LDPC code have been developed using the repetitive decoding scheme. One of them is a sum-product algorithm.

The LDPC coding has a superior error correction capability, thereby improving communication speed and capacity. When combined with a multi-input and multi-output (MIMO) scheme, the LDPC coding can be applied to a high speed wireless LAN having a data transmission speed of several hundred Mbit/s, a high speed mobile communication system having a data transmission speed of one Mbit/s for a user moving at a speed of 250 km/h, and an optical communication system having a data transmission speed of 40 Gbit/s. In addition, the LDPC coding can enable a quantum encryption communication diminishing the number of retransmission on a communication path having low quality since transmission quality is improved due to its high error correction capability. Further, data packets having errors can be easily recovered due to the low complexity and superior loss compensation capability of the LDPC coding, so that contents having quality equal to that of TV can be transmitted through the Internet and the mobile communication system. 10G BASE-T transmission within a range of 100 m which has been considered impossible earlier can be realized owing to wide application range and large capacity which are advantages of the LDPC coding. In addition, transmission capacity of a single satellite transmitter having 36 MHz bandwidth can be increased up to 80 Mbit/s which is 1.3 times of usual transmission capacity. With the above described advantages, the LDPC coding scheme is adopted as a next generation coding scheme in a communication system, like IEEE 802.16 or IEEE 802.11, etc.

Hereinafter, a structured LDPC will be described.

A parity check matrix H is used in the LDPC encoding and decoding method, and includes most of elements 0 and some elements 1. Since the matrix H has a great size of $10^5$ bits or greater, a large sized memory is required to express the matrix H. The structured LDPC expresses the elements of the matrix H used for LDPC encoding and decoding as a sub-block of a certain size as shown in FIG. 7. In IEEE 802.16e, the sub-block is expressed by one integer index to decrease the size of the memory required to store the matrix H. Various kinds of matrixes could be the sub-block. For example, a permutation matrix of a certain size could be the sub-block.

If the structured LDPC is used, one integer (i.e., index) is only needed to be stored in a specific memory instead of a certain sized matrix consisting of elements of 1 or 0. Accordingly, the size of the memory required to express the matrix H can be decreased.

For example, if a size of a codeword reflected in the IEEE802.16e standard is 2304 and a coding rate is 2/3, a model matrix used for LDPC encoding/decoding is as shown in FIG. 8.

As shown in FIG. 8, the structured LDPC matrix of IEEE802.16e consists of elements of −1, 0 and positive integers, wherein −1 represents a zero matrix of which elements are all 0, and 0 represents an identity matrix. The positive integers excluding −1 and 0 constitute a permutation matrix in which the identity matrix is shifted to the right by positive integers. In other words, if elements constituting a matrix are 3, it represents a permutation matrix in which the identity matrix is shifted to the right three times.

Figures 7, 8, 9:
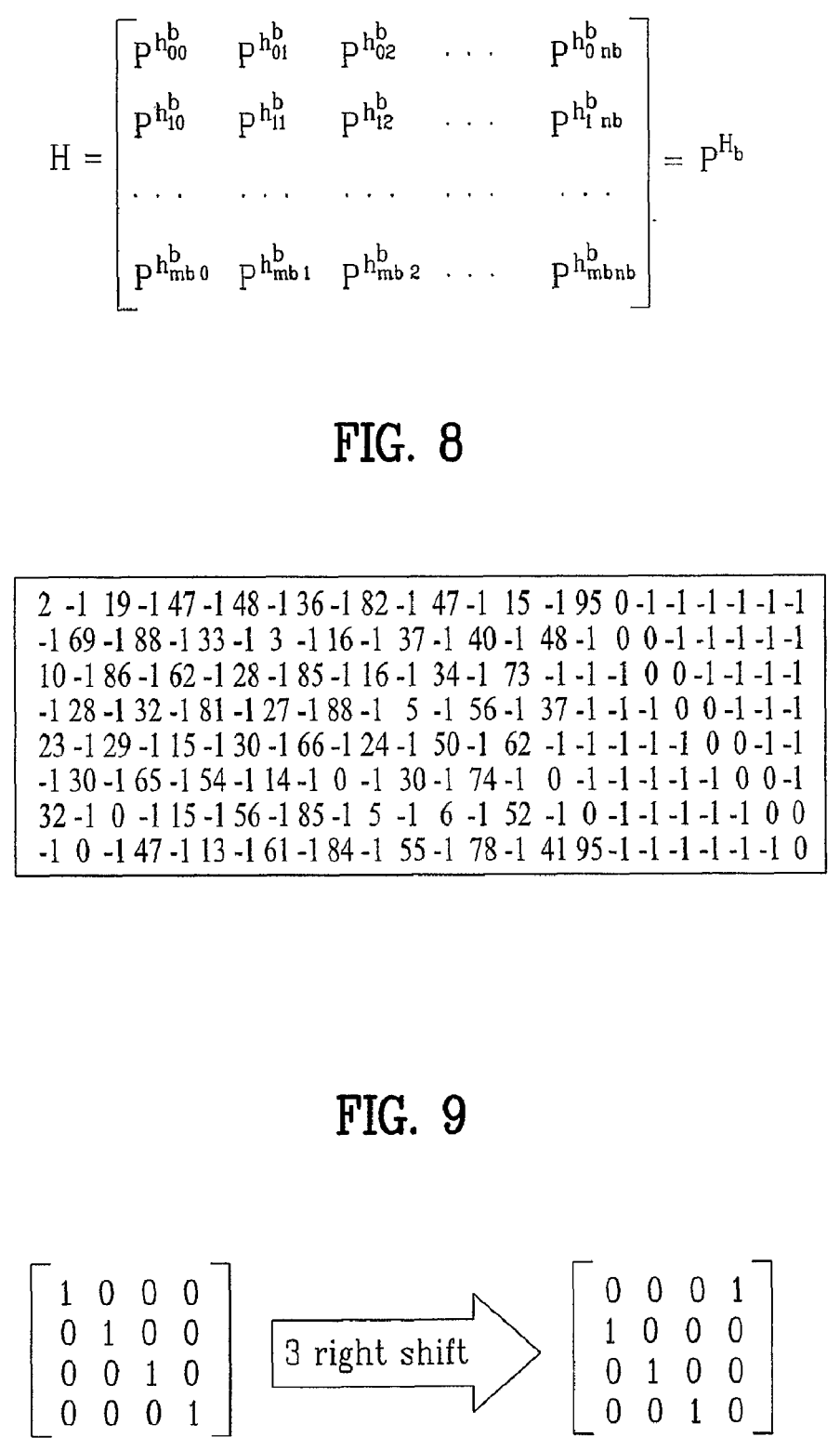

FIG. 9 illustrates a method of expressing a matrix according to the aforementioned positive integers, i.e., shift numbers. It is assumed that a specific matrix H is expressed by a structured matrix of 4×4 (i.e., sub-block). In this case, if the specific sub block is expressed by 3, the sub-block becomes a matrix of FIG. 9.

Hereinafter, LDPC encoding method will be described.

According to a general LDPC encoding method, information bits are encoded by using a generation matrix G derived from an LDPC parity check matrix H. For generating the generation matrix Q the parity check matrix H is configured in the form of $[P^T:I]$ by using a Gaussian reduction method. Assuming the number of the information bits is 'k' and a size of an encoded codeword is 'n', the 'P' is a matrix having 'k' number of rows and '(n−k)' number of columns and the 'I' is an identity matrix having 'k' number of rows and columns.

When the parity check matrix H is represented in the form of $[P^T:I]$, the generation matrix G has the form of $[I:P]$. The information bits of k bits to be encoded can be represented as a matrix 'x' having one row and 'k' number of columns. In this case, the codeword 'c' is represented in the form of the following equation.

$$c=xG=[x:xP]$$

In the above equation, x represents a systematic part, and xP represents a parity part.

Meanwhile, if encoding is performed by the Gaussian Reduction method as above, since a calculation amount is increased, the form of the matrix H is designed in a specific structure so that a method of directly encoding data in the matrix H without deriving the matrix G is used. In other words, if the equation 1 is multiplied by $H^T$ by using a feature (i.e., $GH^T=0$) that a product between the matrix G and a transpose $H^T$ for the matrix H, the following equation 2 can be obtained. The codeword 'c' can be obtained by adding a parity bit suitable for the equation 2 next to the information bit 'x.'

$$cH^T=xGH^T=[x:xP][P^T:I]^T=0 \quad \text{[Equation 2]}$$

Hereinafter, LDPC decoding method will be described.

Data encoded in a communication system includes noise when passing through a radio channel of FIG. 1. A receiver represents a decoding procedure of data through a procedure as shown in FIG. 10. A decoding block of the receiver obtains an information bit 'x' from a receiving signal c'having the encoded codeword 'c' added with noise by using the feature of $cH^T=0$. In other words, assuming that the received codeword is c', a value of $c'H^T$ is calculated. As a result, if the value of $c'H^T$ is 0, first k number of bits from c' are determined as the information bit x. If the value of $c'H^T$ is not 0, c' which satisfies $c'H^T$ of 0 is searched by using a decoding method of a sum-product algorithm through a graph, thereby restoring the information bit x.

Hereinafter, a coding rate of LDPC coding will be described.

Generally, when the size of the information bit is k and the size of the codeword which is actually transmitted is n, a coding rate (R) is as follows.

$$R=k/n \qquad \text{[Equation 3]}$$

When the matrix H necessary for LDPC encoding and decoding has a row size of m and a column size of n, a coding rate is as follows.

$$R=1-m/n \qquad \text{[Equation 4]}$$

As described above, since the related art LDPC code is encoded and decoded by the matrix H, the structure of the matrix H is very important. In other words, since encoding and decoding performance is greatly affected by the structure of the matrix H, design of the matrix H is more important than anything else.

Hereinafter, the related art problems will be described.

The related art, for example, the LDPC encoding method of IEEE 802.16e, supports various coding rates. To this end, a parity check matrix or a model matrix corresponding to each coding rate is stored in an encoder. For example, since IEEE 802.16e supports a coding rate of 1/2, 2/3A, 2/3B, 3/4A, and 5/6, a model matrix according to each coding rate is stored in the memory.

TABLE 1

| Coding rate | Total nonzero weight at model matrix |
|---|---|
| 1/2 | 76 |
| 2/3A | 80 |
| 2/3B | 81 |
| 3/4A | 85 |
| 3/4B | 88 |
| 5/6 | 80 |

In the LDPC encoding or decoding method according to the related art, since a plurality of model matrixes are used, many memories are required in the transmitter and the receiver, and it is difficult to apply the LDPC encoding or decoding method to various kinds of data retransmission methods such as ARQ or HARQ. For example, if data retransmission is performed in accordance with the IR method, a coding rate during initial transmission should be different from that during retransmission. To use different coding rates, encoding should be performed through different model matrixes. In other words, since a first model matrix used during initial transmission is different from a second model matrix used after reception of a NACK, a parity bit generated by the first model matrix becomes different from that generated by the second model matrix, thereby making combining reception in the receiver impossible.

DISCLOSURE OF THE INVENTION

Accordingly, the present invention is directed to a method of encoding data using a parity check matrix, a method of decoding encoded data, and a data retransmission method using the same, which substantially obviate one or more problems due to limitations and disadvantages of the related art.

An object of the present invention is to provide a method of encoding/decoding data using an LDPC code, to which various retransmission methods such as ARQ and HARQ can be applied, and a data retransmission method thereof.

Another object of the present invention is to provide a method of encoding/decoding data using an LDPC code, which supports different coding rates, and a data retransmission method thereof.

Other object of the present invention is to provide a method of encoding/decoding data using an LDPC code, which can improve encoding and decoding efficiency, and a data retransmission method thereof.

To achieve these objects and other advantages and in accordance with the purpose of the invention, as embodied and broadly described herein, a method of retransmitting data in a mobile communication system comprises a first step of encoding an information bit sequence by using a first parity check matrix corresponding to a first coding rate among at least two parity check matrixes corresponding to different coding rates, a second step of transmitting a first codeword generated by encoding of the first step to a receiver, a third step of receiving a negative reception acknowledgement (NACK) from the receiver in response to the first codeword, a fourth step of encoding at least a part of the information bit sequence by using at least a part of a second parity check matrix corresponding to a second coding rate among the at least two parity check matrixes, and a fifth step of transmitting at least a part of a second codeword generated by encoding of the fourth step to the receiver.

In another aspect of the present invention, a method of retransmitting data in a communication system comprises transmitting a codeword encoded by a first parity check matrix corresponding to a first coding rate, among at least two parity check matrixes corresponding to different coding rates, receiving NACK from the receiver in response to the codeword, and transmitting parity bits encoded by a part of a second parity check matrix corresponding to a second coding rate, among the at least two parity check matrixes, to the receiver.

In other aspect of the present invention, a method of decoding data by LDPC code in a receiver of a communication system comprises receiving a first codeword encoded by a first parity check matrix from a transmitter, receiving a parity bit sequence of a second codeword encoded by at least a part of a second parity check matrix from the transmitter, and decoding a codeword sequence, which is obtained by combining a part of the first codeword with the parity bit sequence of the second codeword received from the transmitter, by using the second parity check matrix.

BRIEF DESCRIPTION OF THE DRAWINGS

FIG. 7 illustrates a concept of a sub-block on a parity check matrix;

FIG. 8 is an example of a model matrix suggested in the related art;

FIG. 9 illustrates a concept of a model matrix expanded to a parity check matrix;

FIG. 11A and FIG. 11B illustrate a model matrix to which HARQ scheme can be applied in accordance with one embodiment of the present invention;

FIG. 12A to FIG. 12I illustrate various model matrixes of a lower triangle type according to the preferred embodiment of the present invention;

FIG. 15 illustrates features of a parity check matrix used in one embodiment of the present invention;

FIG. 26 illustrates a method of selecting information bit sequence used when encoding and decoding are performed in accordance with the embodiment of the present invention;

BEST MODE FOR CARRYING OUT THE INVENTION

Hereinafter, structures, operations, and advantages of the present invention will be understood readily by the preferred embodiments of the present invention, examples of which are illustrated in the accompanying drawings.

Hereinafter, a matrix which represents a parity check matrix by using a sub-block of a specific size of z×z depending on the aforementioned structured LDPC will be referred to as a model matrix. Each sub-block of the model matrix can be expanded to various kinds of models by a specific index. The model matrix uses an index as its element. Each sub-block of the model matrix can be determined by various methods depending on the index. Hereinafter, it is assumed that the index is a shift number of an identity matrix of a specific size (z×z). In other words, each sub-block is generated by shifting each row or column of a base matrix (for example, identity matrix) of z×z dimension in a certain direction. Each sub-block can be identified by the shifted number of each row or column. A method of generating each sub-block from the base matrix is not limited to shift of row or column. A sub-block having an index of '−1' is a zero matrix of a specific size (z×z).

The model matrix can be expanded to a specific parity check matrix depending on indexes. In other words, each index of the model matrix can be replaced with a sub-block depending on rules indicated by each index to generate a parity check matrix. In other words, performing encoding and decoding by using the model matrix means that encoding and decoding are performed by a specific parity check matrix generated by the model matrix.

According to the aforementioned related art, in order to obtain an apparatus for encoding/decoding data, which supports a plurality of coding rates, model matrixes equivalent to the number of the supported coding rates are required. However, in this embodiment of the present invention, encoding and decoding are performed using one mother matrix.

The mother matrix could be a model matrix or a parity check matrix. Also, the parity check matrix may be generated by being expanded from a specific model matrix. Hereinafter, a method of performing encoding using a specific model matrix as a mother matrix will be described.

Figure 1:
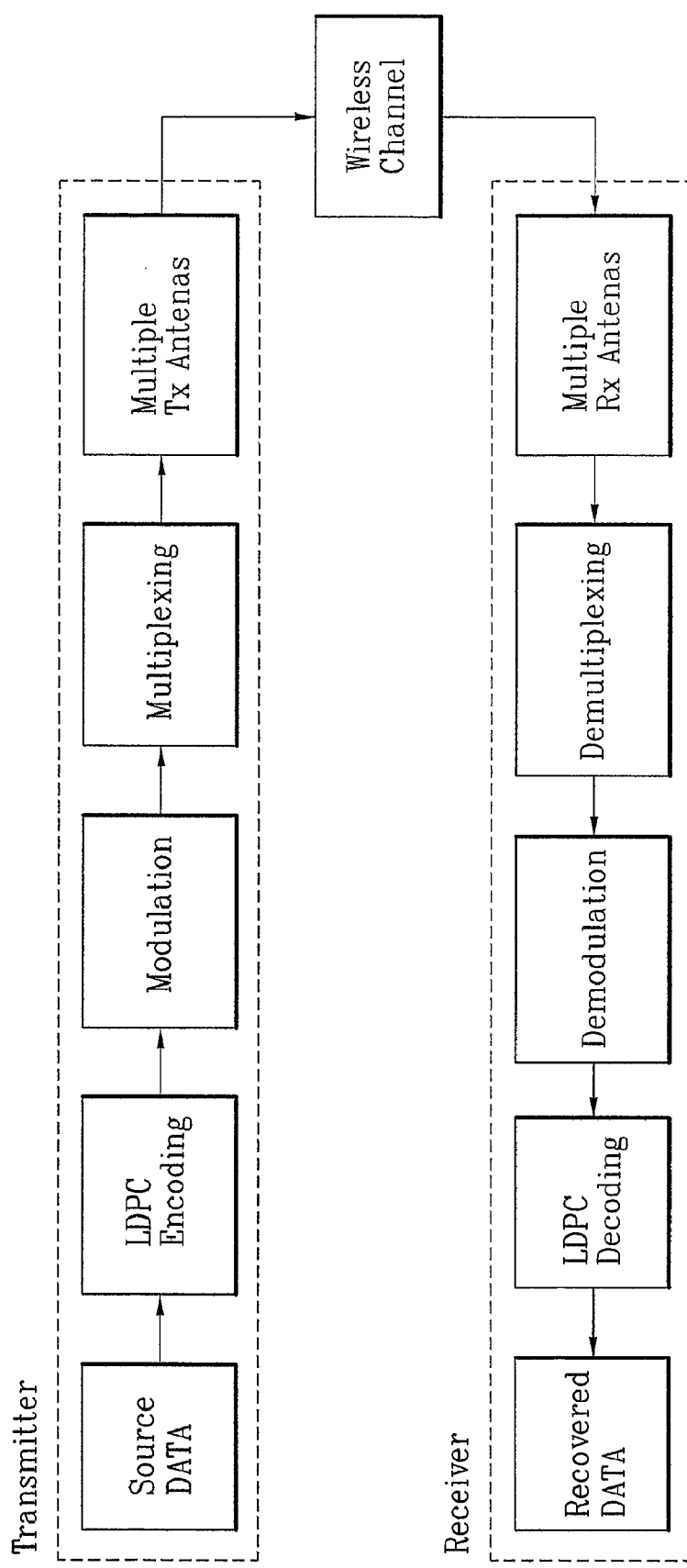
FIG. 1 illustrates a structure of a mobile communication channel to which the present invention and the related art are applied.
Figure 2:
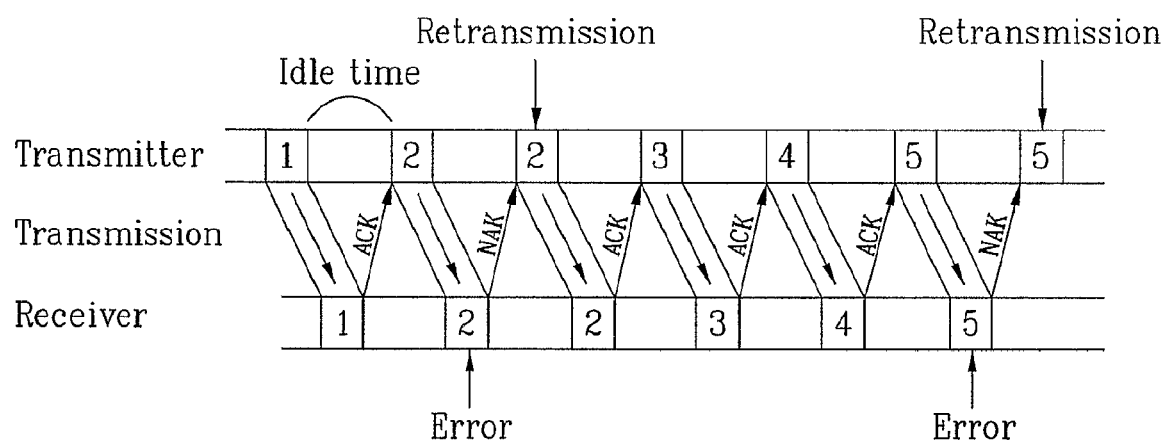
FIG. 2 to FIG. 4 illustrate a retransmission method according to the related art.
Figure 3:
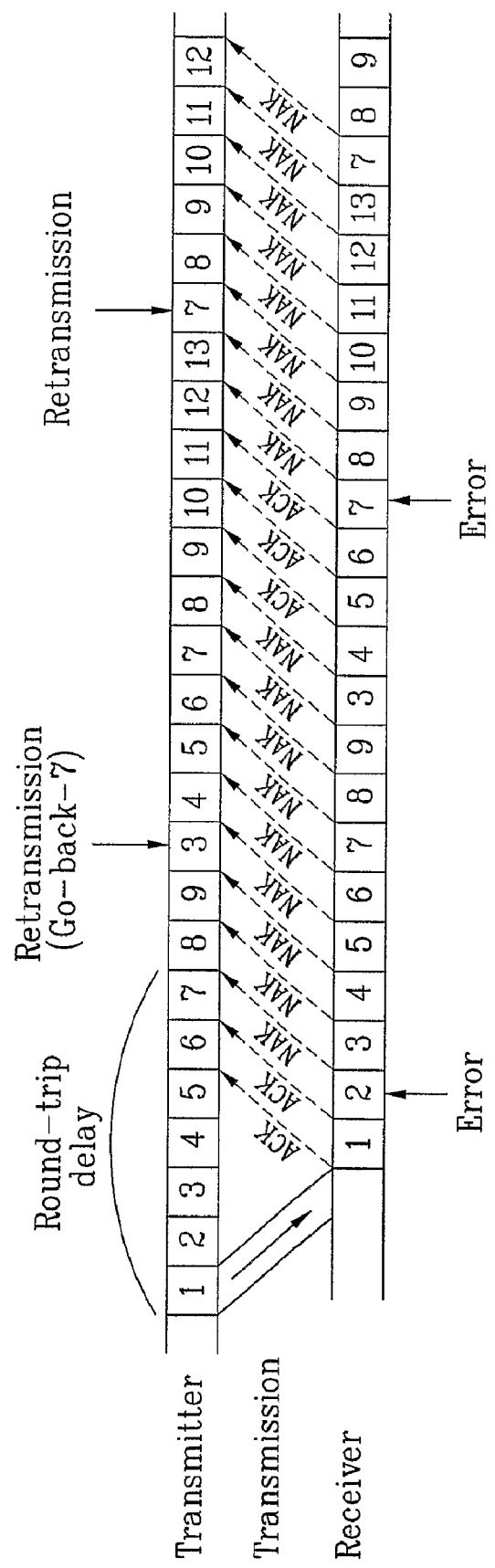
Figure 4:
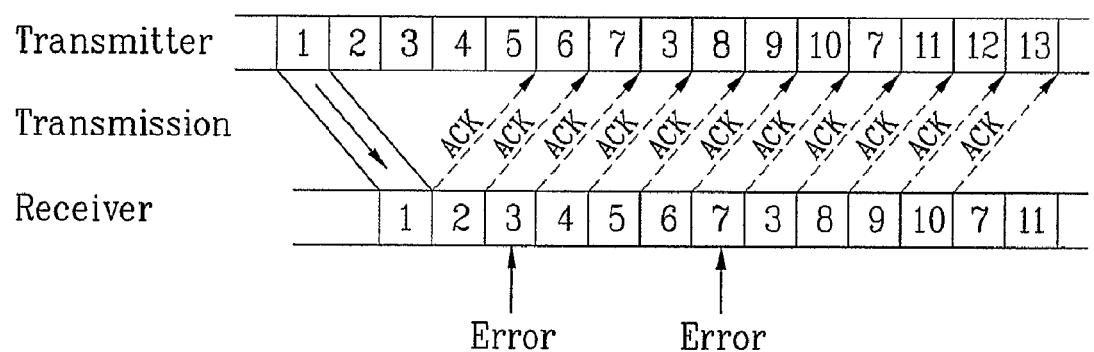
Figure 5:
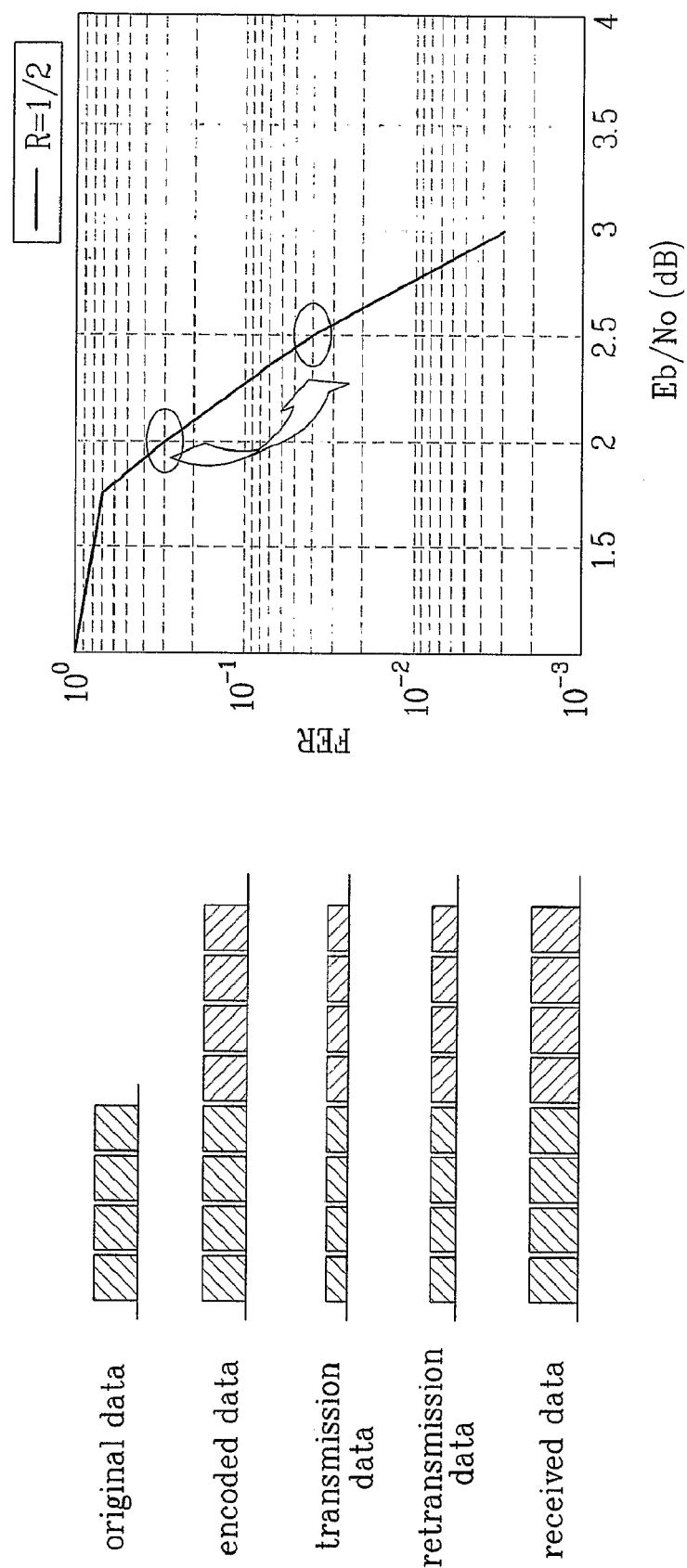
FIG. 5 and FIG. 6 illustrate a retransmission method according to the related art and the present invention.
Figure 6:
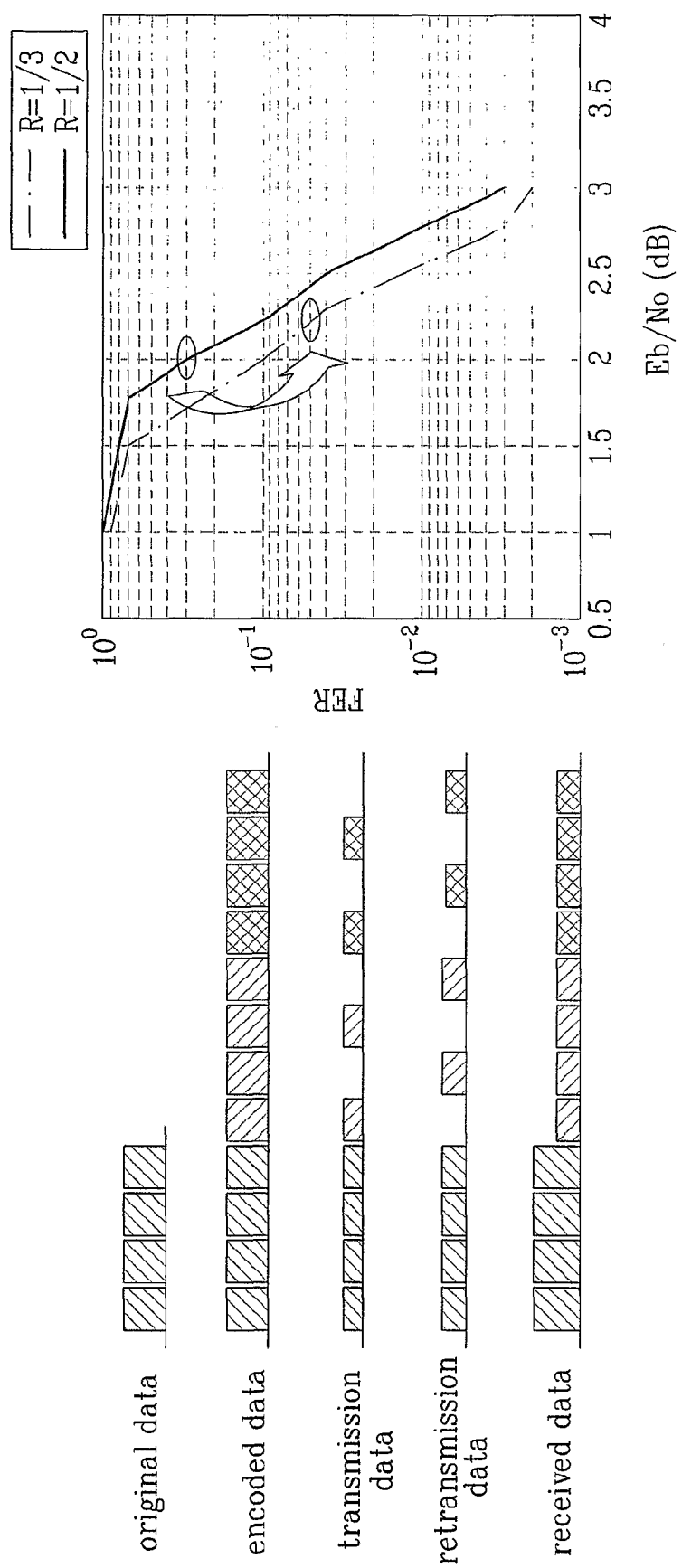
Figure 10:
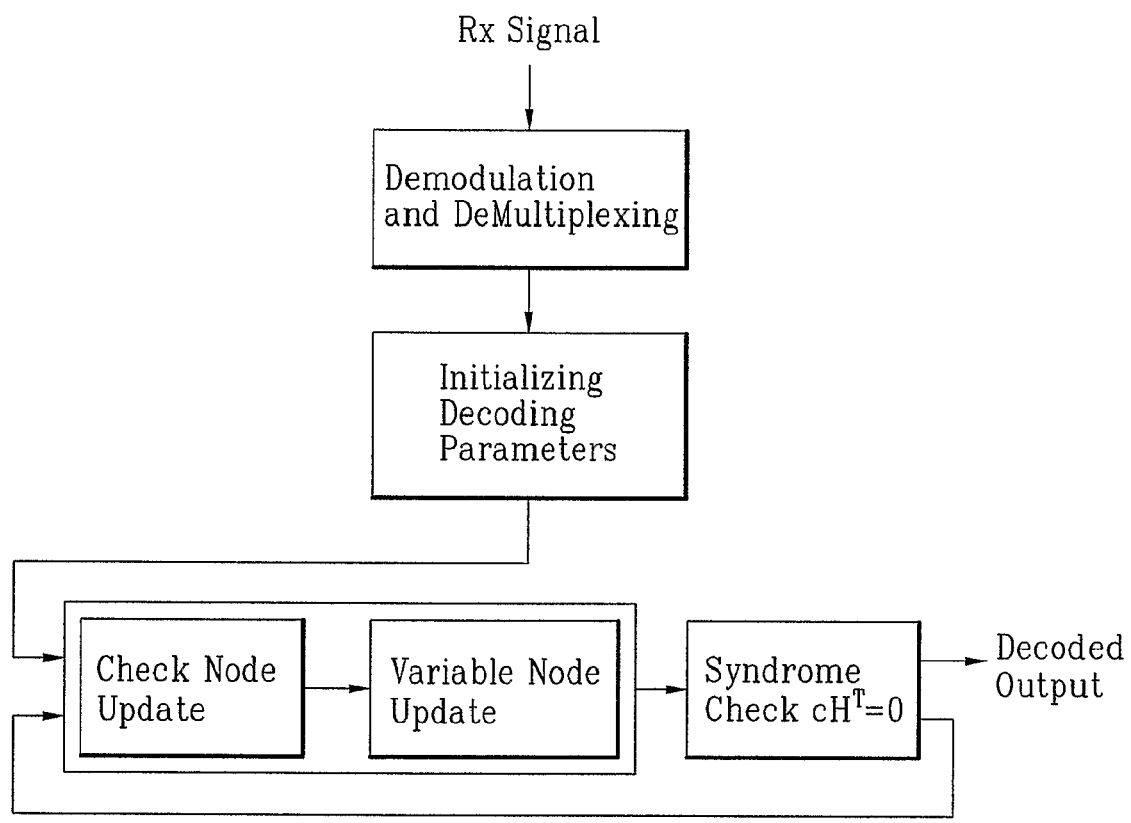
FIG. 10 illustrates a method of decoding data using LDPC according to the related art and the present invention.
Figure 11A:
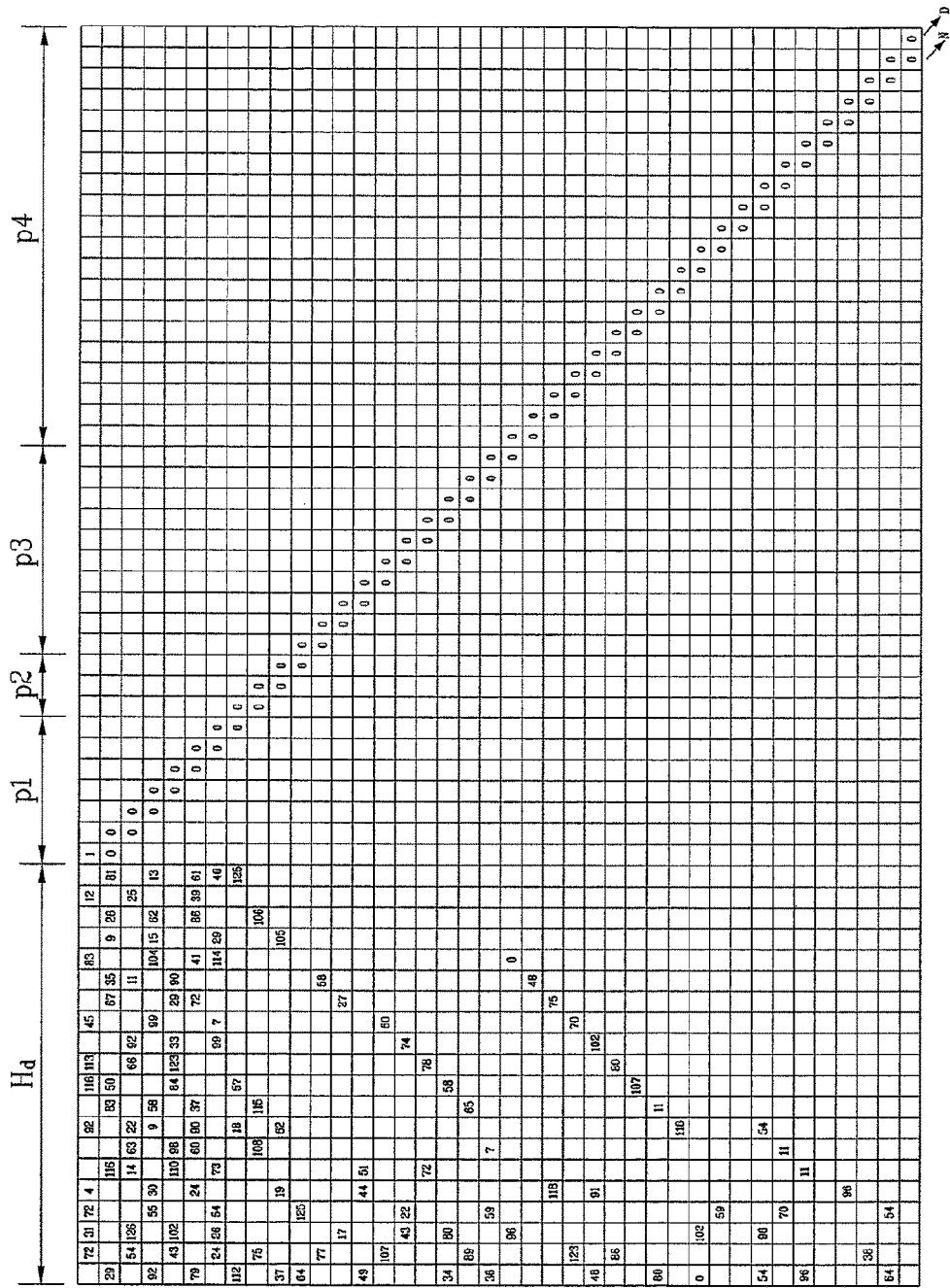

FIG. 11A illustrates a model matrix to which an HARQ scheme can be applied in accordance with one embodiment of the present invention. If it is assumed that a model matrix of FIG. 11A is $H_b$, the model matrix $H_b$ consists of a systematic part $H_d$ and a parity part $H_p$, wherein the systematic part corresponds to an information bit sequence. The model matrix can be arranged by the following equation.

$$H_b = [(H_{b1})_{m_b * k_b} | (H_{b2})_{m_b * m_b}]$$ [Equation 5]

The $m_b$ represents the number of sub-blocks located in the model matrix of FIG. 11A in a column direction. Also, the $k_b$ represents a value obtained by subtracting the $m_b$ from the number $n_b$ of sub-blocks located in a row direction of the model matrix. In other words, the systematic part of the model matrix has a size of $m_b \times k_b$ in case of a unit of a sub-block. Also, the parity part of the model matrix has a size of $m_b \times m_b$ in case of a unit of a sub-block. A coding rate R is determined by the size of the model matrix, i.e., $R = k_b/(k_b + m_b)$.

The model matrix used in the embodiment of the present invention is preferably designed in a format of a lower triangle type. Hereinafter, the lower triangle type will be described. Various model matrixes suggested in the embodiment of the present invention have dual diagonal elements in the parity part. The dual diagonal elements according to the embodiment of the present invention consist of one diagonal element D and an element N adjacent to the diagonal element D as shown. The adjacent element N is located to be lower than the diagonal element. In other words, the adjacent element is located at the left of the diagonal element. Lower and upper elements and left and right elements of the matrix are variable depending on a viewing direction of the matrix. The mother matrix according to the embodiment of the present invention will be described below in view of another aspect.

It is assumed that a specific model matrix is $[H_d:H_p]$, a row of a sub-block in the parity part of the model matrix is r, a column thereof is indexed as c, and a shift number for a specific sub-block is $A_{r,c}$. In this case, the index $A_{r,c}$ has a random integer not '−1' in case of r=c and r=c+1. In other words, if the parity part of the specific model matrix has 16 sub-blocks, the parity part is determined as shown in Equation 6 below.

$$\begin{pmatrix} A_{0,0} = x_1 & A_{0,1} = -1 & A_{0,2} = -1 & A_{0,3} = -1 \\ A_{1,0} = x_2 & A_{1,1} = x_3 & A_{1,2} = -1 & A_{1,3} = -1 \\ A_{2,0} = y_1 & A_{2,1} = x_4 & A_{2,2} = x_5 & A_{2,3} = -1 \\ A_{3,0} = y_2 & A_{3,1} = y_3 & A_{3,2} = x_6 & A_{3,3} = x_7 \end{pmatrix} \quad \text{[Equation 6]}$$

In the above equation, $x_i$ and $y_i$ represent random positive integers. Since the parity part of the model matrix or the parity check matrix can be arranged variously depending on a design method of the dual diagonal elements, the mother matrix of FIG. 11A can be expressed that it has been designed in accordance with the lower triangle type.

FIG. 12A to FIG. 12I illustrate various model matrixes according to the low triangle type. In the model matrix of FIG. 12A to FIG. 12I, x_1 to x_21, y_1 to y45, and z1 to z55 represent random shift numbers. Since the x_1 to x_21 are dual diagonal elements, they may have various shift numbers excluding '−1' which means a zero matrix. Also, since the systematic part ($H_d$-part) of the model matrix of FIG. 12A to FIG. 12I may have various shift numbers, display of the shift numbers will be omitted.

Figure 12A:
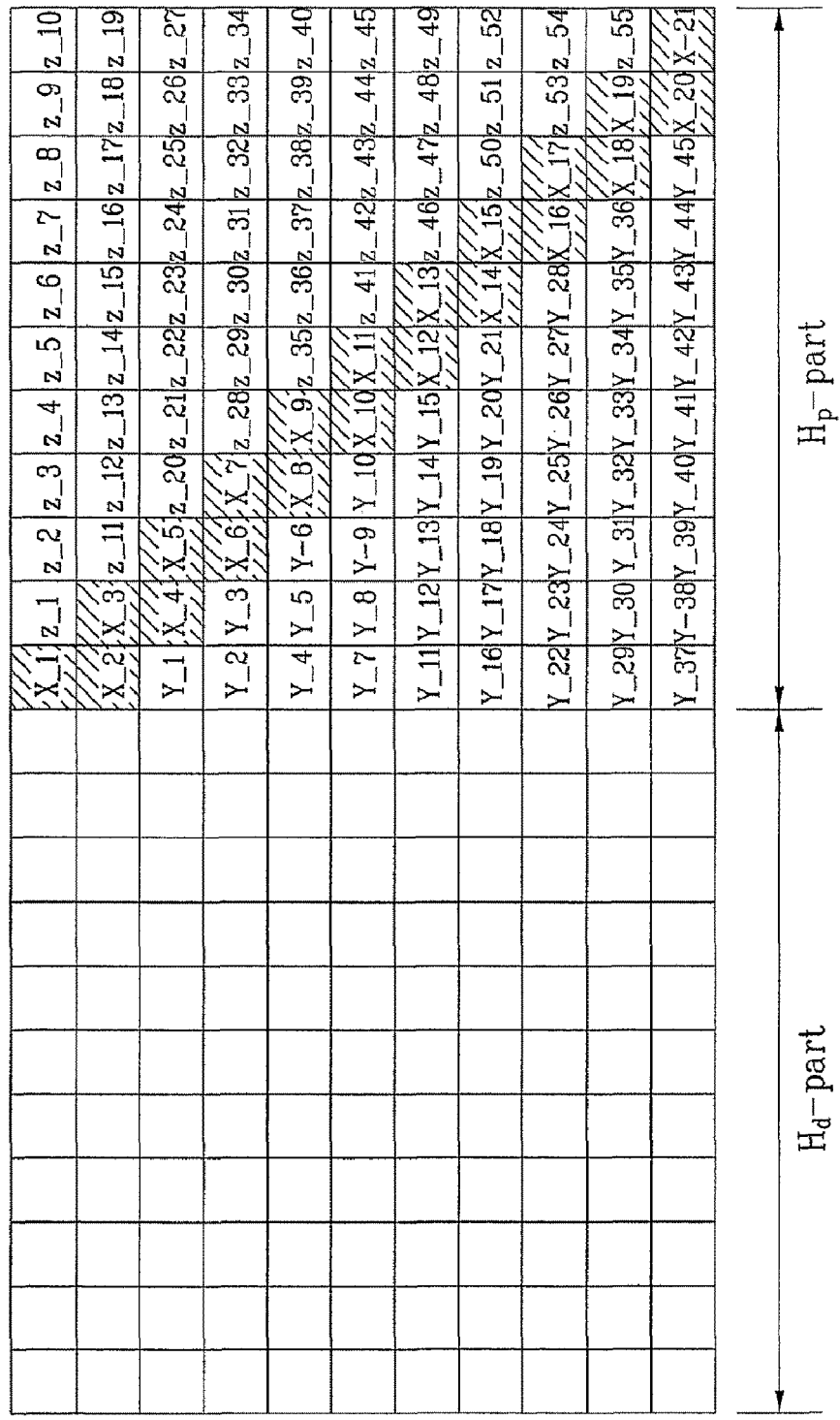
Figure 12B:
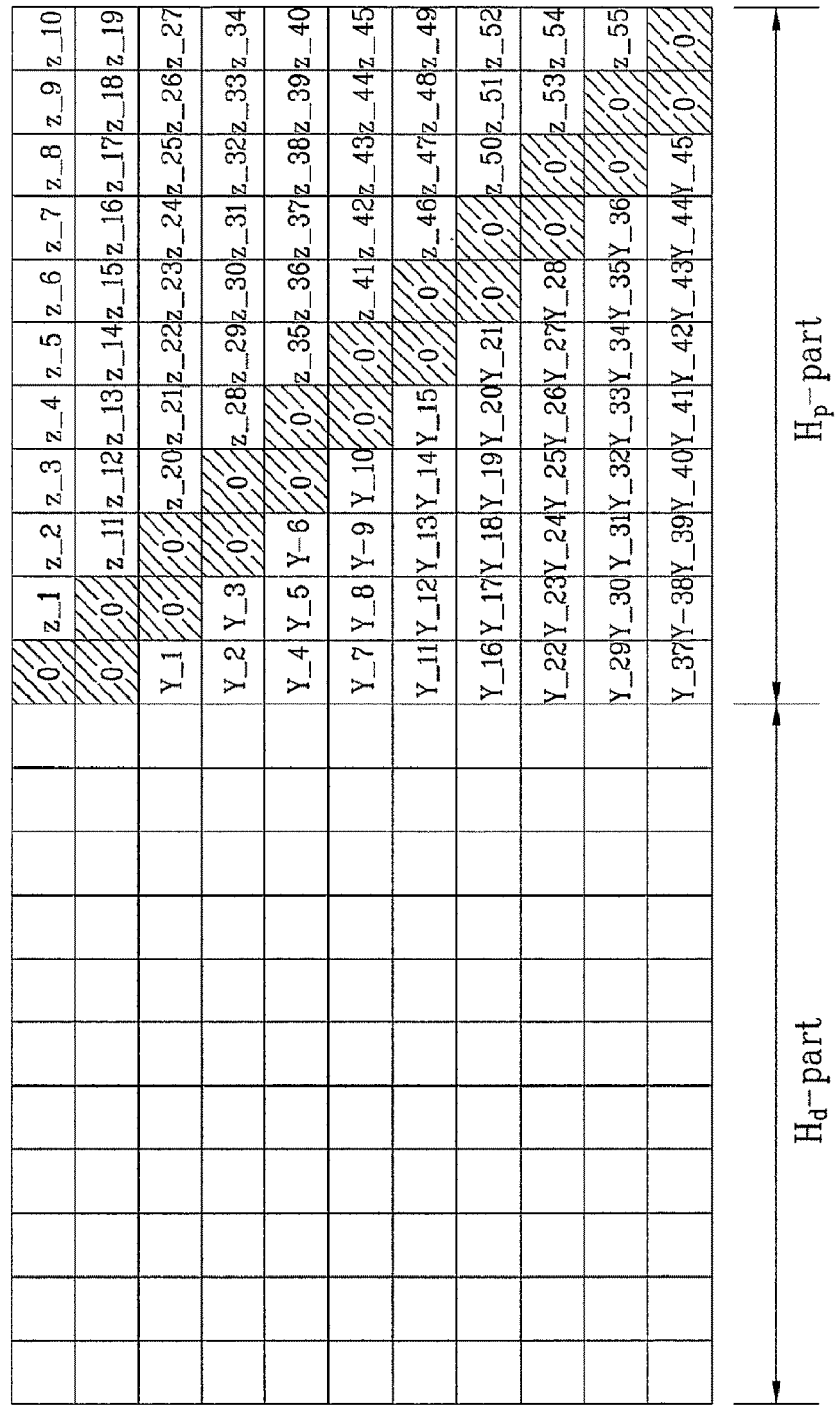
Figure 12C:
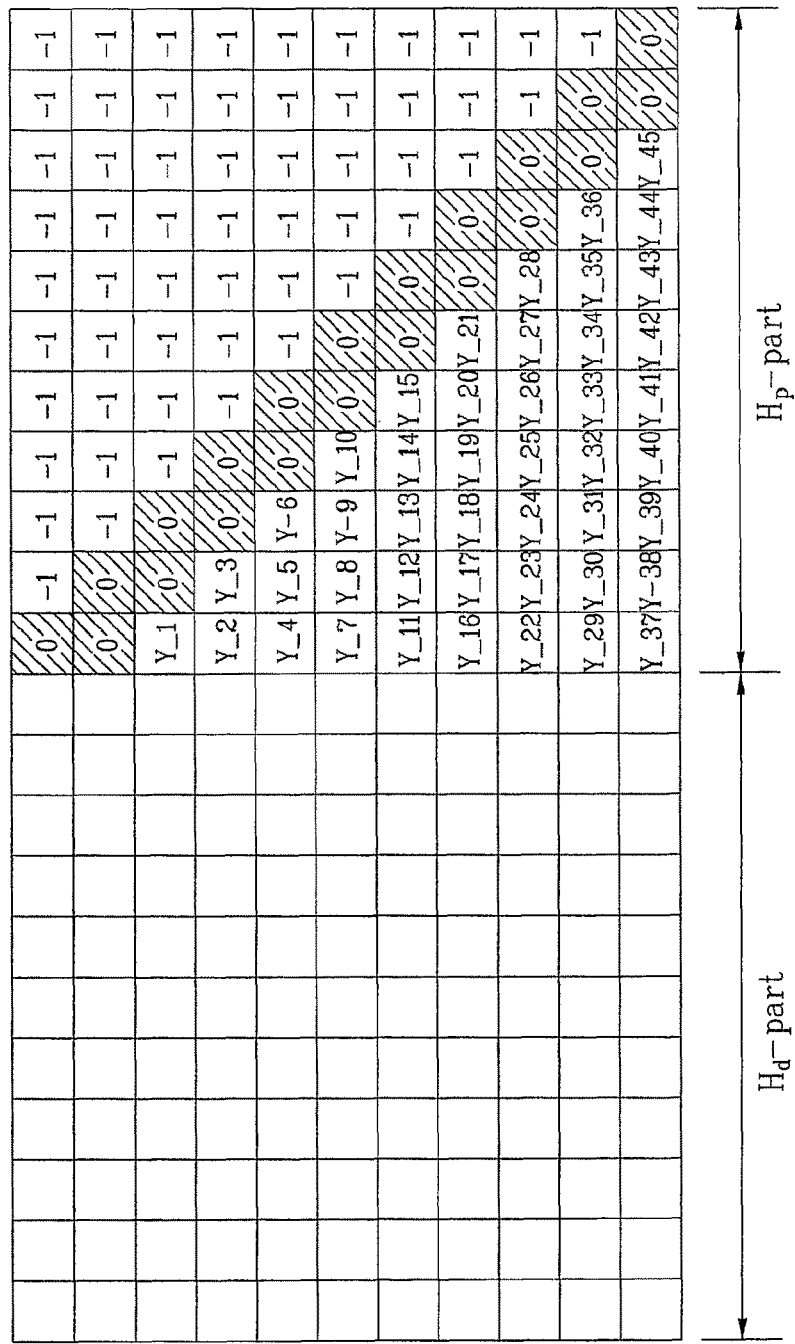
Figure 12D:
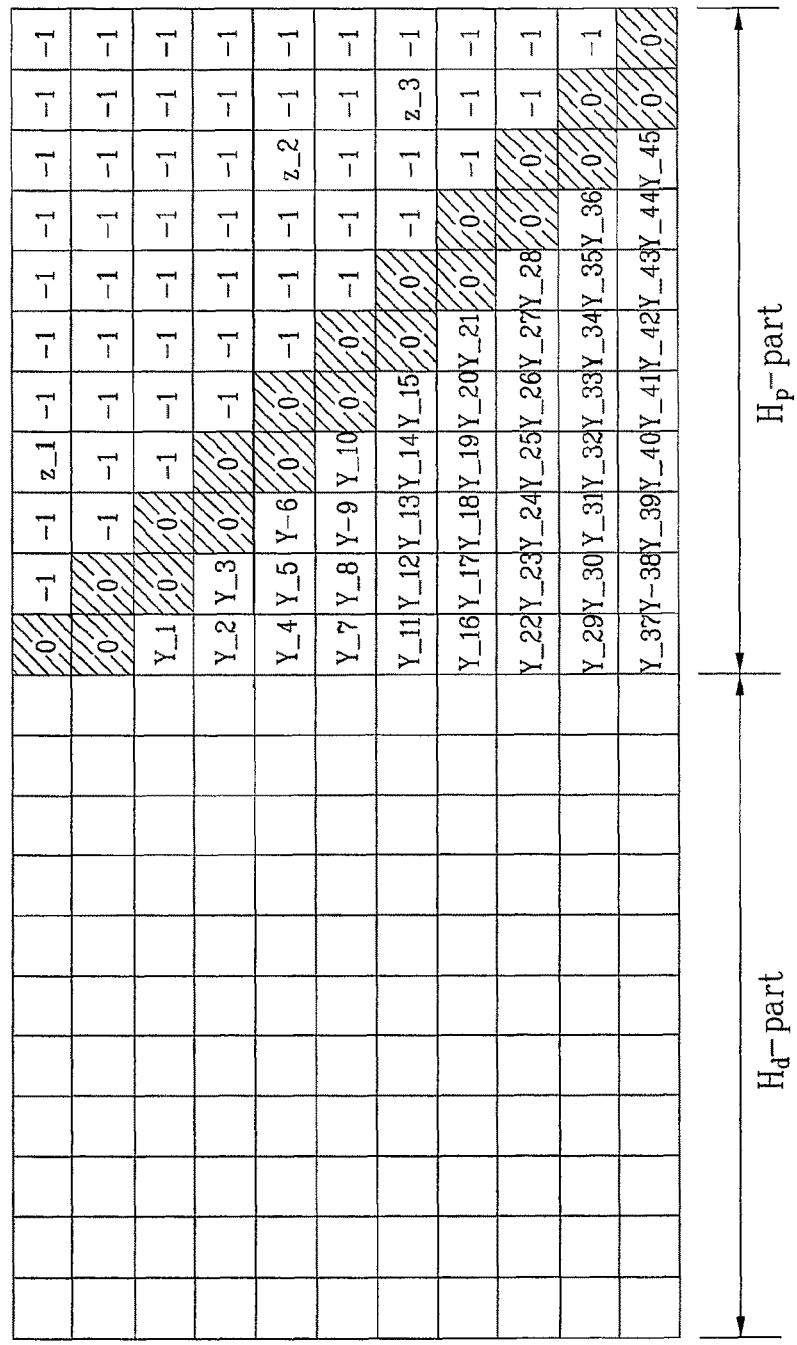
Figure 12E:
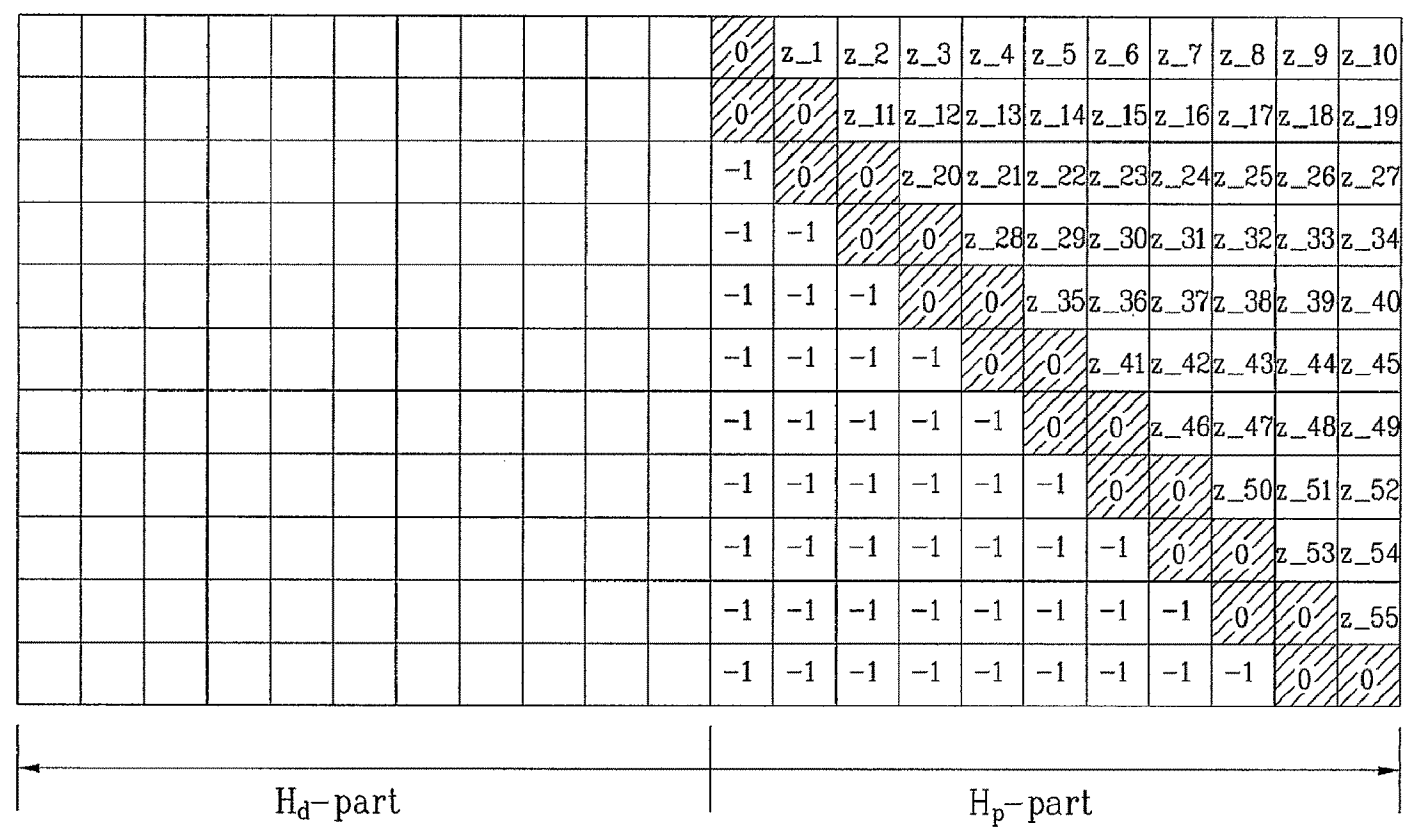
Figure 12G:
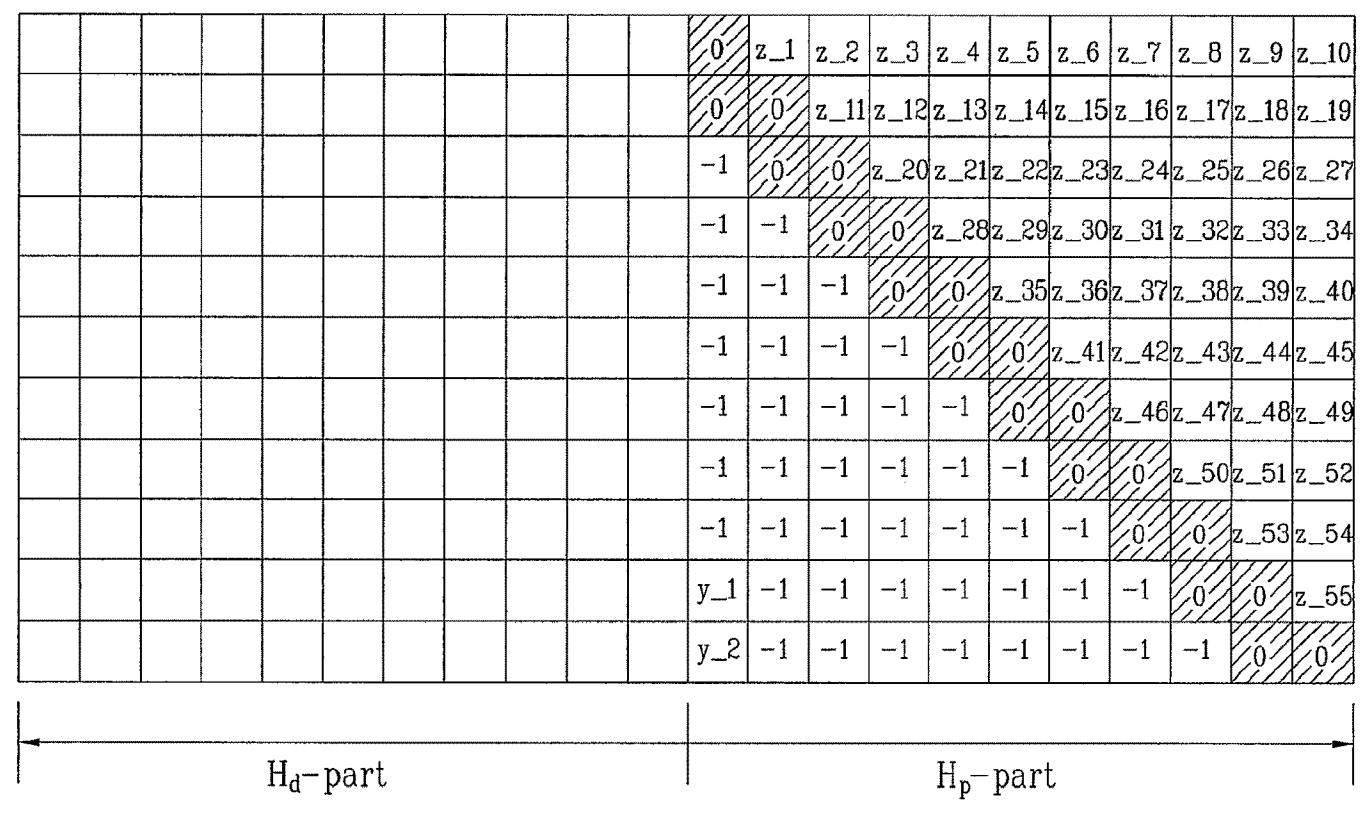
Figure 12H:
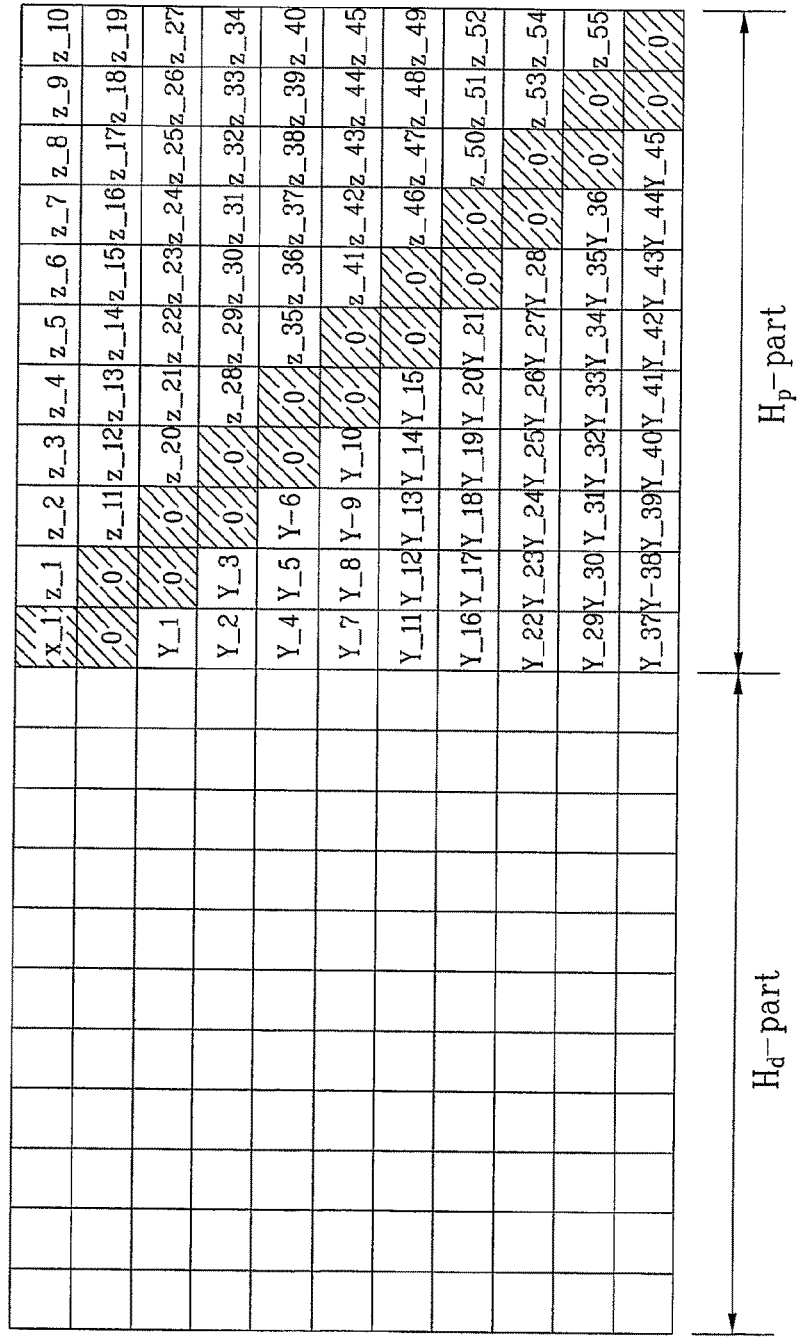
Figure 12I:
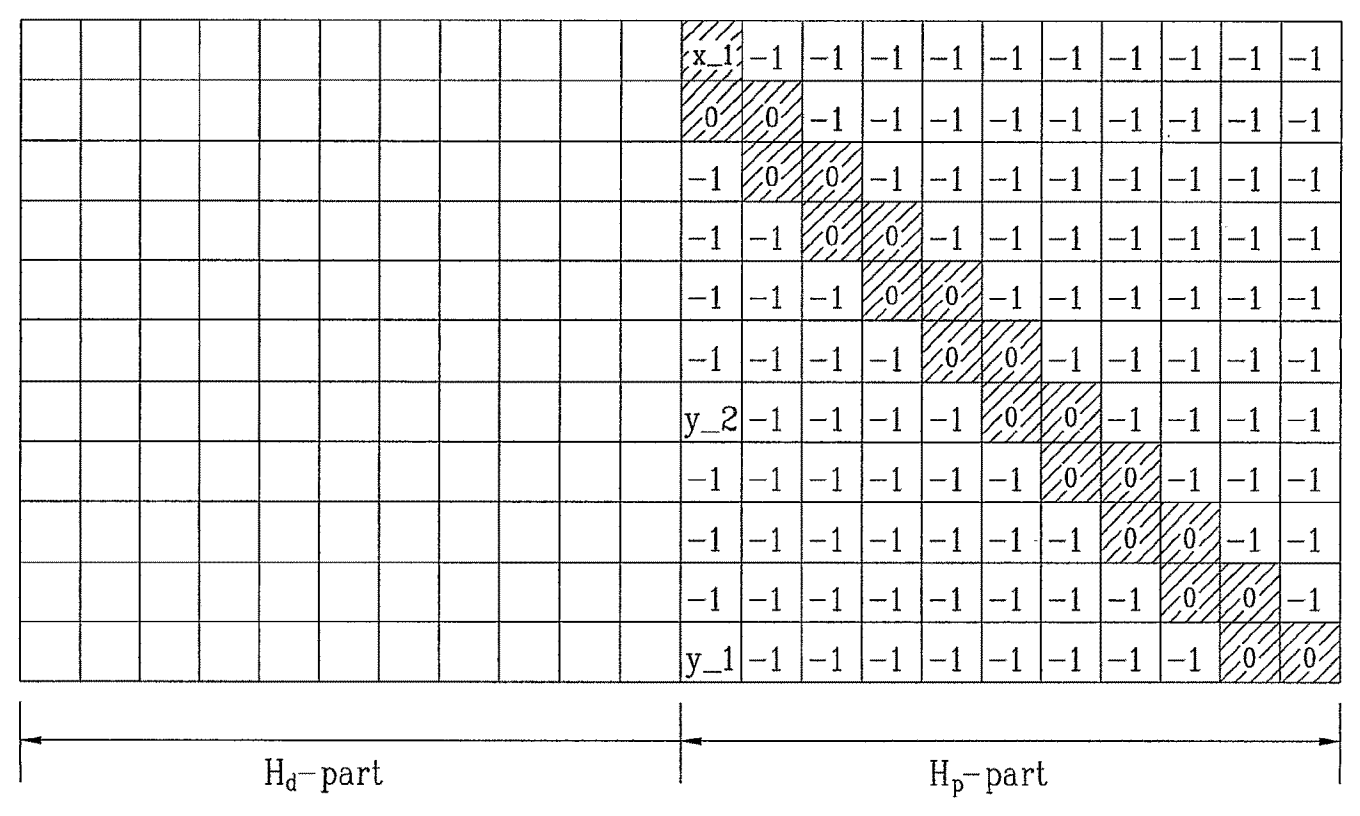

As shown in FIG. 12A, the dual diagonal elements of the model matrix and the other elements except for the dual diagonal elements may have the same value or different values. Also, as shown in FIG. 12B, the dual diagonal elements of the model matrix designed in accordance with the lower triangle type could be shift numbers of '0'. As shown in FIGS. 12C and 12D, the elements located above the dual diagonal elements of the model matrix designed in accordance with the lower triangle type could be shift numbers of '−1' corresponding to a zero matrix. However, as shown in FIG. 12D, the model matrix designed in accordance with the lower triangle type may include a specific number of elements z1, z2, z3 not '−1.' FIG. 12E illustrates another example of the model matrix designed in accordance with the lower triangle type. As shown, the elements located below the dual diagonal elements could be shift numbers of '−1' corresponding to a zero matrix. Also, as shown in FIG. 12F and FIG. 12G, some of the elements located below the dual diagonal elements could be elements y_1 not '−1.' FIG. 12H and FIG. 12I illustrate another example of the model matrix designed in accordance with the lower triangle type. As shown, the element x_1 of the model matrix designed in accordance with the lower triangle type could be a random element not '0' and '−1,' and a specific number of elements located in the same column as that of the random element could be random elements not '−1.' The location and number of the elements not '−1', which are located in the same column as that of the dual diagonal elements not '0,' can be determined variously. In other words, the location and number of the elements not '−1' can have various values depending on the encoder which generates parity bits or the structure of the systematic part of the model matrix.

The mother matrix suggested in the present invention is classified depending on a plurality of regions, and systematic parts of the respective regions preferably have different weight densities.

First, the plurality of regions provided in the mother matrix will be described.

Figure 11B:
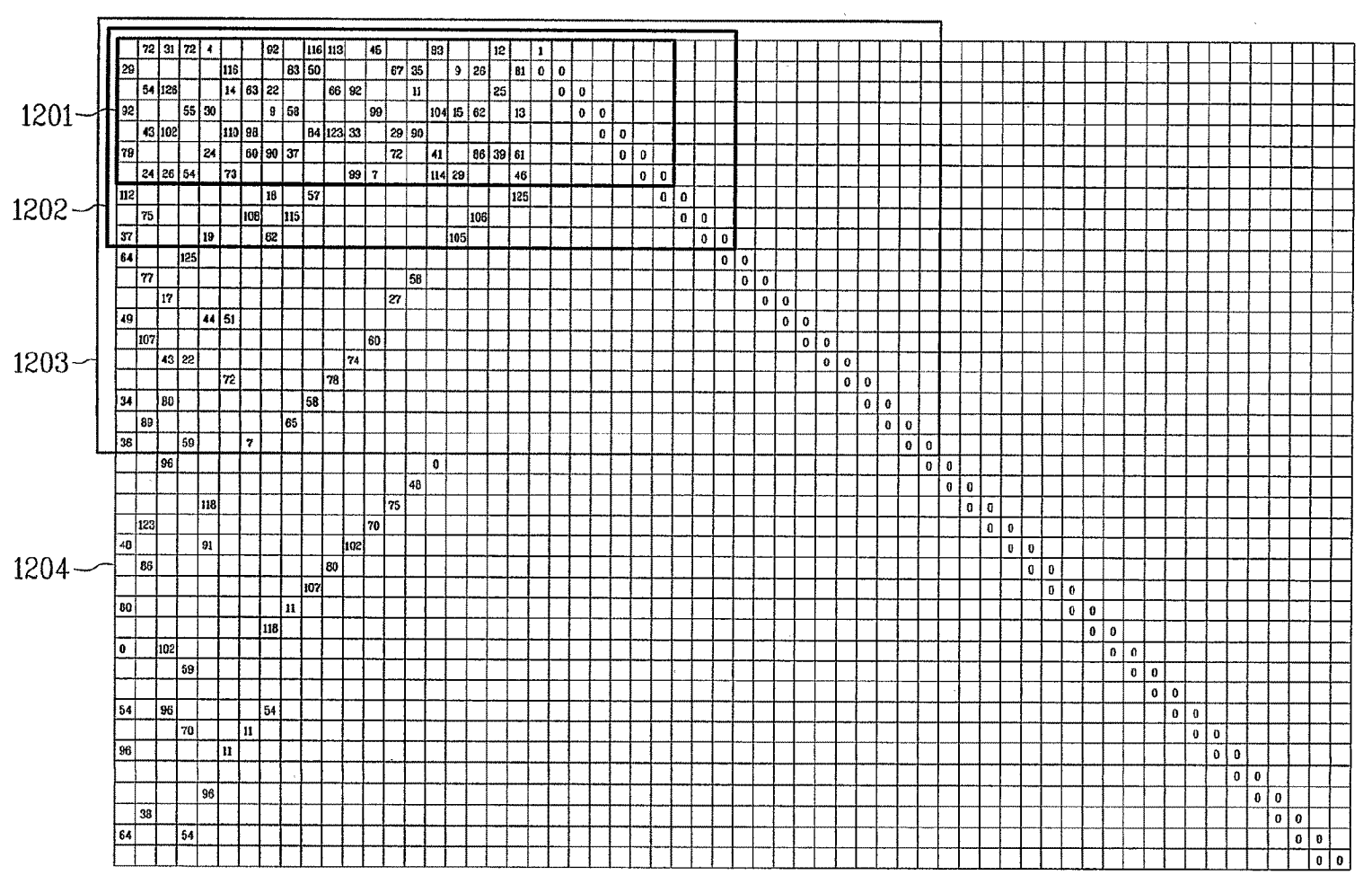

In the example of FIG. 11B, a coding rate of the mother matrix 1204 is 1/3, and sub-matrixes of the mother matrix 1204 are located in the regions 1201, 1202 and 1203. A sub-matrix is a region of the mother matrix, and is configured as shown in FIG. 11B. In other words, information bits encoded by the regions 1201, 1202 and 1203 has the same length as that of information bits encoded by the mother matrix 1204. The sub-matrixes are different from one another in their sizes and have unique coding rates depending on their sizes. For example, the first sub-matrix 1201 has a coding rate of about 3/4 (exactly, 20/27), the second sub-matrix 1202 has a coding rate of 2/3, and the third sub-matrix 1203 has a coding rate of 1/2. Also, a sub-matrix which generates a codeword having a lower coding rate includes a sub-matrix which generates a codeword having a higher coding rate. The mother matrix according to this embodiment is characterized in that it includes at least one sub-matrix. Although the mother matrix is divided into four regions for convenience of description in this embodiment, there is no limitation in the number of the divided regions.

In this embodiment of the present invention, encoding/decoding is performed using the aforementioned mother matrix. In this case, encoding/decoding is performed by entire or a part of the mother matrix. In other words, encoding/decoding is performed by the mother matrix or at least one sub-matrix to support a plurality of coding rates. For example, an encoder provided in a transmitter can perform encoding by storing the mother matrix in a memory and reading entire or a part of the mother matrix depending on a desired coding rate. Also, a decoder provided in a receiver can perform decoding by storing the mother matrix in its memory and reading entire or a part of the mother matrix depending on the coding rate used in the transmitter. In other words, although different model matrixes are conventionally stored in the memory depending on each coding rate, if encoding and decoding are performed using the mother matrix suggested in this embodiment of the present invention, entire or a part of one mother matrix are used. Thus, various kinds of coding rates can be supported with a small sized memory.

As described above, the systematic parts of the respective regions of the mother matrix according to this embodiment of the present invention preferably have different weight densities. Hereinafter, weight of the systematic part of the sub-matrix divided depending on the respective regions will be described.

Weight density for row or column in the systematic part of each sub-matrix of the mother matrix is preferably determined by each sub-matrix. The weight represents the number of non-zero elements which are not '0' in a specific row or column. Also, the weight density represents a rate between non-zero elements and entire elements in a specific row or column. In more detail, it is preferable that the weight density of row or column for the systematic part of the first sub-matrix 1201 is the highest. It is preferable that the weight density of row or column for the systematic part of the second sub-matrix 1202 is the second highest. It is also preferable that the weight density of row or column for the systematic part of the third sub-matrix 1203 is the third highest. It is also preferable that the weight density of row or column for the systematic part of the mother matrix 1204 is the lowest.

In other words, the weight density of row or column for the systematic part of the mother matrix 1204 is preferably determined differently depending on the systematic part determined depending on the coding rate. Also, it is more preferable that the weight density of row or column for the systematic part which supports a high coding rate is higher than the weight density of row or column for the systematic part which supports a low coding rate.

Hereinafter, a method of encoding data using the mother matrix according to the first embodiment of the present invention and retransmitting the encoded data in accordance with the HARQ scheme will be described.

Figure 13:
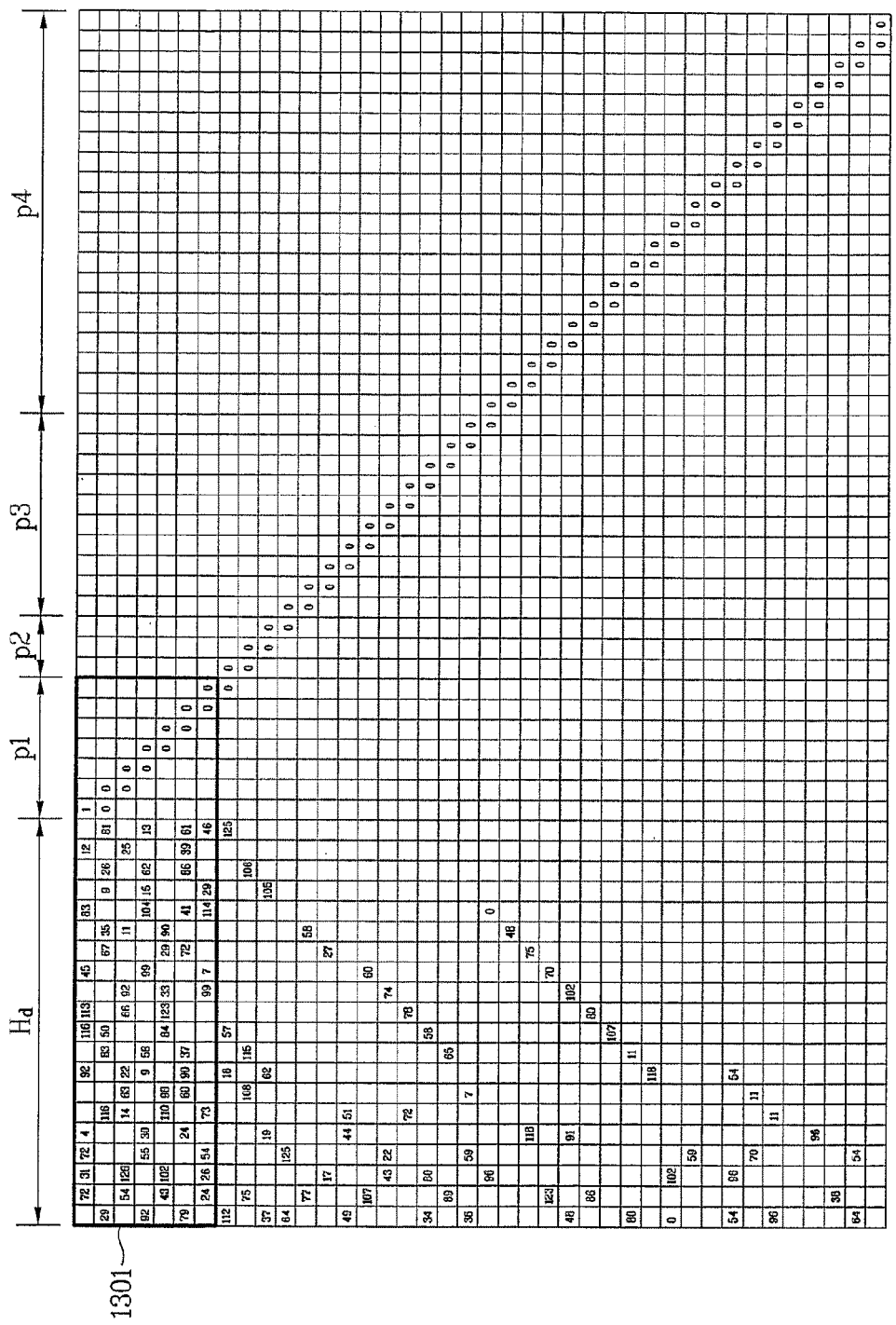
FIG. 13, FIG. 14, FIG. 16 and FIG. 17 illustrate a mother matrix to illustrate a data retransmission method according to another embodiment of the present invention.

FIG. 13 illustrates a method of performing encoding using the first region 1301 of the mother matrix. Hereinafter, the mother matrix divided into four regions will be described.

In other words, the systematic parts of the respective regions preferably have different weight densities.

First, the transmitter performs encoding by using the first region 1301 of the mother matrix according to this embodiment of the present invention. Since LDPC encoding is a systematic encoding method, an information bit sequence corresponding to the systematic part $H_d$ of the mother matrix is included in the information bit as it is. However, parity bits $p_1$ calculated depending on a structure of the systematic part of the first region is additionally included in the information bit sequence.

In short, the transmitter performs encoding in accordance with the first region 1301 and transmits, to the receiver, a codeword consisting of the information bit sequence and parity bit sequence $p_1$. Since a coding rate according to the encoding is determined depending on a rate between row and column of the first region, the transmitter transmits data at a coding rate of about 3/4 (exactly, coding rate of 20/27). The receiver performs decoding by using the mother matrix used in the transmitter. The receiver does not request retransmission, if no error occurs in the received data, in accordance with the HARQ scheme, i.e., if the received data is successfully decoded. However, the receiver requests the transmitter of retransmission if it fails to successfully decode the received data. In other words, the receiver performs decoding by using the first region 1301 used in the transmitter, and sends ACK to the transmitter if a syndrome test or cyclic redundancy check (CRC) test succeeds. However, if the syndrome test or the CRC test is failed, the receiver sends NACK to the transmitter to request retransmission.

Figure 14:
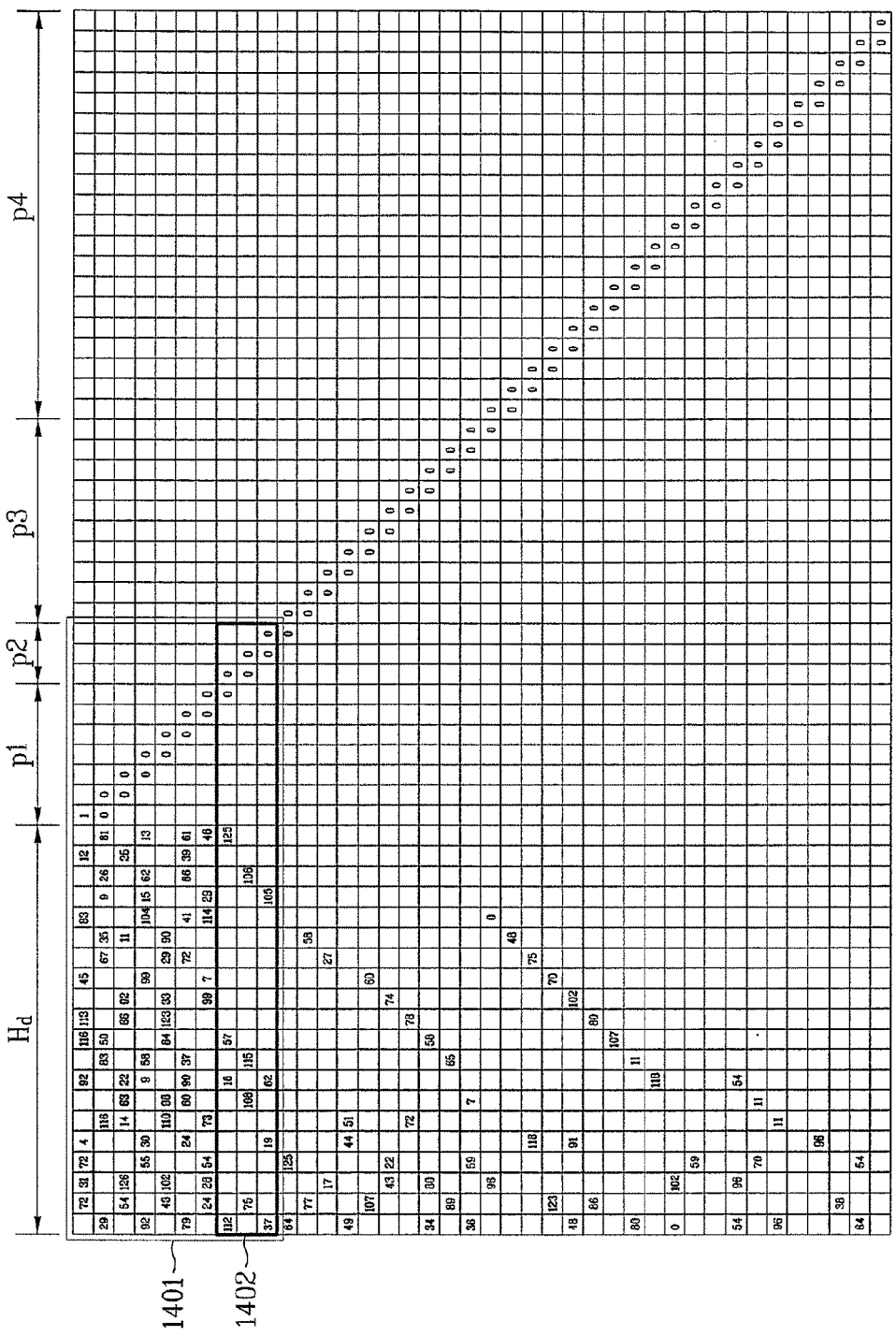

If the transmitter receives NACK, the transmitter performs encoding by using the mother matrix as shown in FIG. 14. The transmitter performs encoding by using the second region 1401 of the mother matrix according to this embodiment to decrease an actual coding rate from 3/4 to 2/3. However, since the mother matrix according to this embodiment is designed in a lower triangle type, the transmitter does not need to perform encoding by using the entire part of the second region 1401. In other words, the transmitter may calculate $p_2$ by performing calculation for the region 1402 corresponding to the parity bit $p_2$ of the second region and transmit $P_2$ only to the receiver.

If encoding is performed using a general model matrix, encoding corresponding to the entire of the region 1401 is required. This is because that encoding of the entire of the systematic part is required to calculate specific parity bits in case of the general model matrix. In other words, calculation for the entire of the region 1301 of FIG. 13 and calculation for the entire of the region 1401 of FIG. 14 are sequentially required. Also, the transmitter which uses the general model matrix transmits the codeword including $H_d$ and $p_1$ by performing encoding of FIG. 13 and transmits the codeword including $H_d$, $p_1$ and $p_2$ by again performing encoding of FIG. 14. In other words, the transmitter should retransmit the parity bits which have been already transmitted before receiving NACK.

However, since the mother matrix according to this embodiment is the model matrix designed in accordance with the lower triangle type, the transmitter can perform encoding calculation by the region 1402 corresponding to the additional parity bits to calculate the additional parity bits $p_2$, and transmit only the additional parity bits to the receiver.

The reason why that partial calculation can be performed using the mother matrix according to this embodiment will be described with reference to FIG. 15.

FIG. 15 illustrates an example of encoding performed by the parity check matrix of the lower triangle type according to this embodiment. In the example of FIG. 15, although encoding will be described based on the parity check matrix operated in a bit unit for convenience of description, the encoding method according to the present invention may be applied to both the model matrix and the parity check matrix, and the encoding operation may be performed in a bit unit or sub-block unit.

Information bits of FIG. 15 are $a_0, a_1, a_2, a_3$, and parity bits $p_0, p_1, p_2, p_3$ may additionally be provided by the parity check matrix of FIG. 15. Among the parity bits, the first parity bit $p_0$ is calculated through calculation of a part of the systematic part of FIG. 15.

In other words, $p_0$ can be calculated through only calculation $p_0 = a_1 \oplus a_3$ for the first row of FIG. 15. Also, $p_1$ can be calculated through only calculation $p_1 = a_0 \oplus a_2 \oplus p_0$ for the second row of FIG. 15. When the value $p_1$ is being obtained, the value $p_0$ is required but is not needed to be newly obtained because the value $p_0$ is already calculated. Likewise, $p_2$ and $p_3$ can be obtained. In short, if a codeword which include $a_0, a_1, a_2, a_3$, $p_0$ are generated to obtain the $p_0$, encoding is only needed for the first row of FIG. 15. If calculation of $p_1$ is additionally required after $p_0$ is obtained, encoding for the second row of FIG. 15 can be performed without encoding for the first row of FIG. 15. Consequently, if the mother matrix of the lower triangle type according to this embodiment is used, calculation for the region corresponding to the additional parity bits is performed, and only the additional parity bits can be transmitted.

The receiver performs decoding using the region 1401 of FIG. 14 used in the transmitter. In more detail, since the receiver uses the IR method of the HARQ scheme, the receiver performs decoding by together receiving transmission data $H_d$, $p_1$ received at a coding rate of 3/4 and a part $p_2$ of encoded data which has not been used for initial transmission. The receiver sends ACK which does not request the transmitter of retransmission if the syndrome test or the CRC test succeeds. However, if the syndrome test or the CRC test is failed, the receiver sends NACK to the transmitter to request retransmission.

Figure 16:
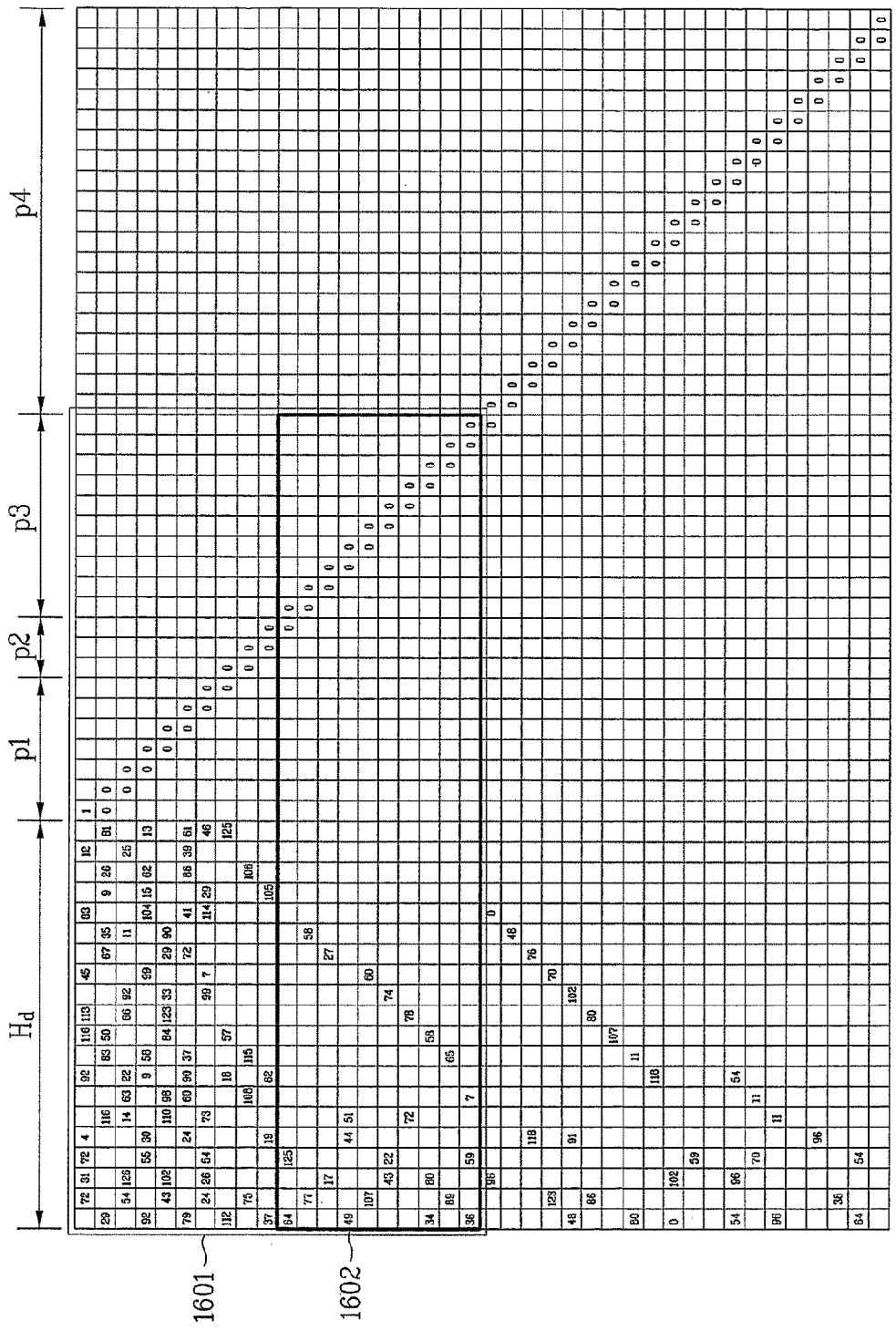

If the transmitter receives NACK after sending a signal of a coding rate of 2/3, the transmitter performs encoding by using the mother matrix as shown in FIG. 16. In other words, the transmitter performs encoding by using the third region 1601 of FIG. 16 to decrease an actual coding rate from 2/3 to 1/2. However, since the mother matrix according to this embodiment is designed in a lower triangle type, the transmitter does not need to perform encoding by using the entire part of the third region 1601. In other words, the transmitter may calculate $p_3$ by performing calculation for the region 1602 corresponding to the parity bits $p_3$ of the third region and transmit $P_3$ only to the receiver.

The receiver performs decoding by using the region 1601 of FIG. 16 used in the transmitter. In more detail, since the receiver uses the IR method of the HARQ scheme, the receiver performs decoding by together receiving transmission data $H_d$, $p_1$ received at a coding rate of 3/4, parity bits $p_2$ which have not been used for initial transmission and parity bits $p_3$. The receiver sends ACK which does not request the transmitter of retransmission if the syndrome test or the CRC test succeeds. However, if the syndrome test or the CRC test is failed, the receiver sends NACK to the transmitter to request retransmission.

Figure 17:
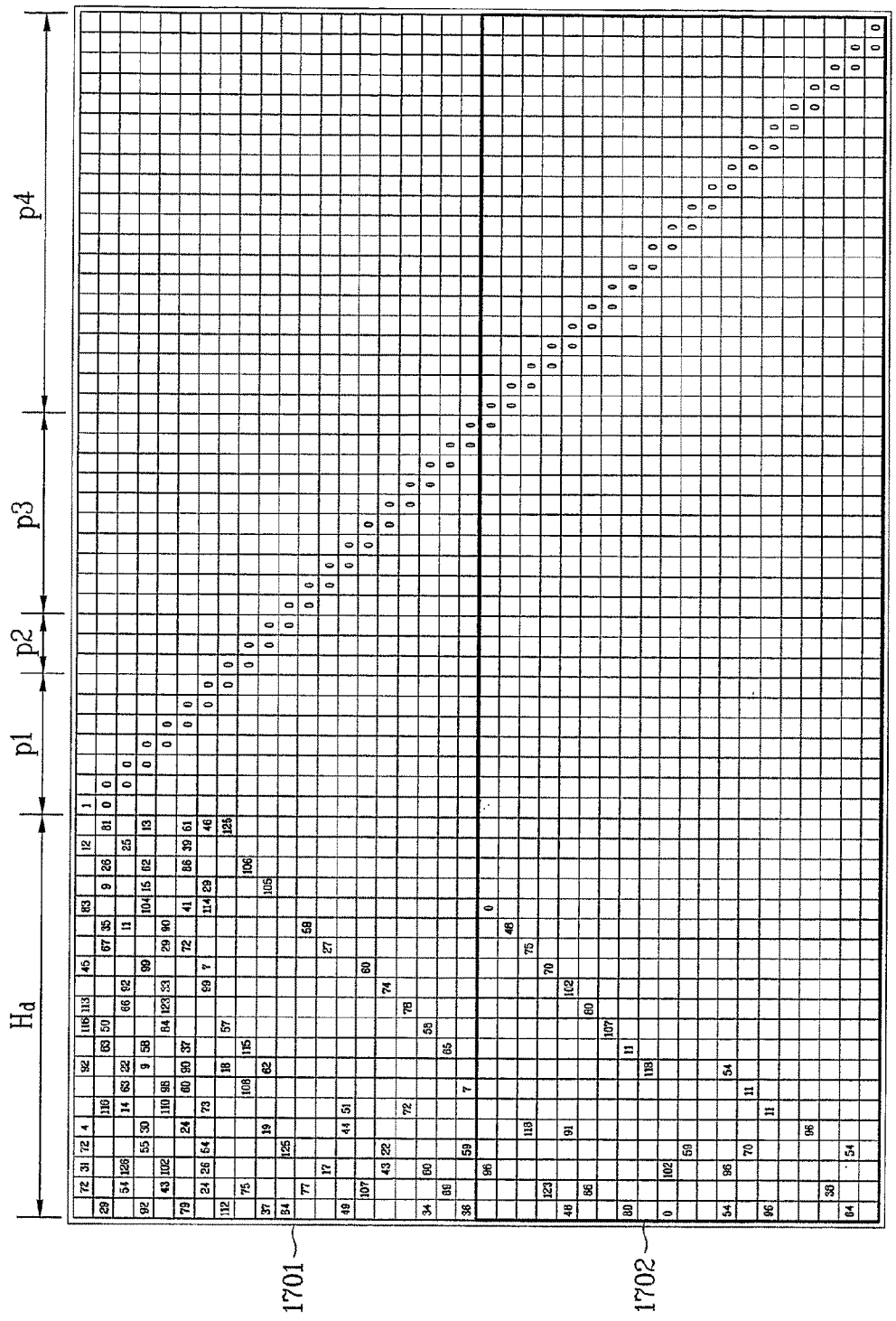

If the transmitter receives NACK after sending a signal of a coding rate of 1/2, the transmitter performs encoding by using the mother matrix as shown in FIG. 17. In other words, the transmitter performs encoding by using the fourth region 1701 of the mother matrix according to this embodiment, i.e., the entire region, so as to decrease an actual coding rate from 1/2 to 1/3. However, since the mother matrix according to this embodiment is designed in a lower triangle type, the transmitter does not need to perform encoding by using the entire part of the fourth region 1701. In other words, the transmitter may calculate $p_4$ by performing calculation for the region 1702 corresponding to the parity bits $p_4$ of the fourth region and transmit $P_4$ only to the receiver.

The receiver performs decoding by using the region 1701 of FIG. 17 used in the transmitter. Since the receiver uses the IR method of the HARQ scheme, the receiver performs decoding by together receiving transmission data $H_d$, $p_1$ received at a coding rate of 3/4, parity bits $p_2$ which have not been used for initial transmission, parity bits $p_3$, and parity bits $p_4$. The receiver sends ACK which does not request the transmitter of retransmission if the syndrome test or the CRC test succeeds. However, if the syndrome test or the CRC test is failed, the receiver sends NACK to the transmitter to request retransmission.

The mother matrix according to this embodiment has been designed in accordance with the lower triangle type and is divided into a plurality of regions. Preferably, the systematic parts of the respective regions have different weight densities. Since weight densities of the systematic parts of the respective regions are different from one another and the weight density of the systematic part corresponding to the high coding rate is high, various coding rates can efficiently be supported through a small sized memory.

This embodiment of the present invention is characterized in that although retransmission is performed using the IR method, a target coding rate can freely be selected by using one parity check matrix. An example of a communication method which freely selects a target coding rate includes a puncturing method used in a turbo code. The puncturing method will be compared with the first embodiment as follows. The puncturing method does not transmit a specific part of the entire mother code. According to the puncturing method, the receiver regards a part to which no data has not been transmitted as an unstable symbol or bit and performs decoding by using the entire mother matrix. On the other hand, in this embodiment, the transmitter performs encoding by using a part of the mother matrix, and the receiver also performs decoding by using a part of the mother matrix. The difference between this embodiment and the puncturing method will be described in view of complexity of decoding. If decoding complexity of the mother matrix and the mother code is 100 (coding rate of 3/4), the IR method which uses the puncturing method has decoding complexity of 100. However, in this embodiment, decoding complexity is decreased depending on some region of the mother matrix determined depending on the coding rate. For example, if the target coding rate is 3/4, decoding complexity is only 32. In other words, the region of the mother matrix which should perform calculation for decoding is only 32% of the entire region of the mother matrix. If the decoding complexity is decreased, the cost of the decoder can be decreased. In addition to decrease of decoding complexity, this embodiment is more advantageous than the puncturing method. In the puncturing method, specific data are regarded as unstable bits or symbols to perform decoding even in case of no transmission of the specific data. In this case, decoding performance is decreased. However, in this embodiment, excellent decoding performance is obtained along with various coding rates.

If a coding rate is 1/2 and, in this case, decoding complexity is 100, decoding complexity according to each coding rate is as shown in Table 2 below.

TABLE 2

| Coding rate Scheme | Encoding complexity | | Decoding complexity | |
|---|---|---|---|---|
| | Puncturing method | This embodiment | Puncturing method | This embodiment |
| 3/4 | 100% | 52% | 100% | 52% |
| 2/3 | 100% | 64% | 100% | 64% |
| 1/2 | 100% | 100% | 100% | 100% |

As shown in Table 2, according to the related art puncturing method, encoding complexity and decoding complexity are determined depending on the coding rate of the mother matrix regardless of high and low of the coding rate. However, according to this embodiment, since encoding complexity and decoding complexity are determined depending on the coding rate, it is advantageous in that the cost can be reduced in actual hardware.

Figure 18:
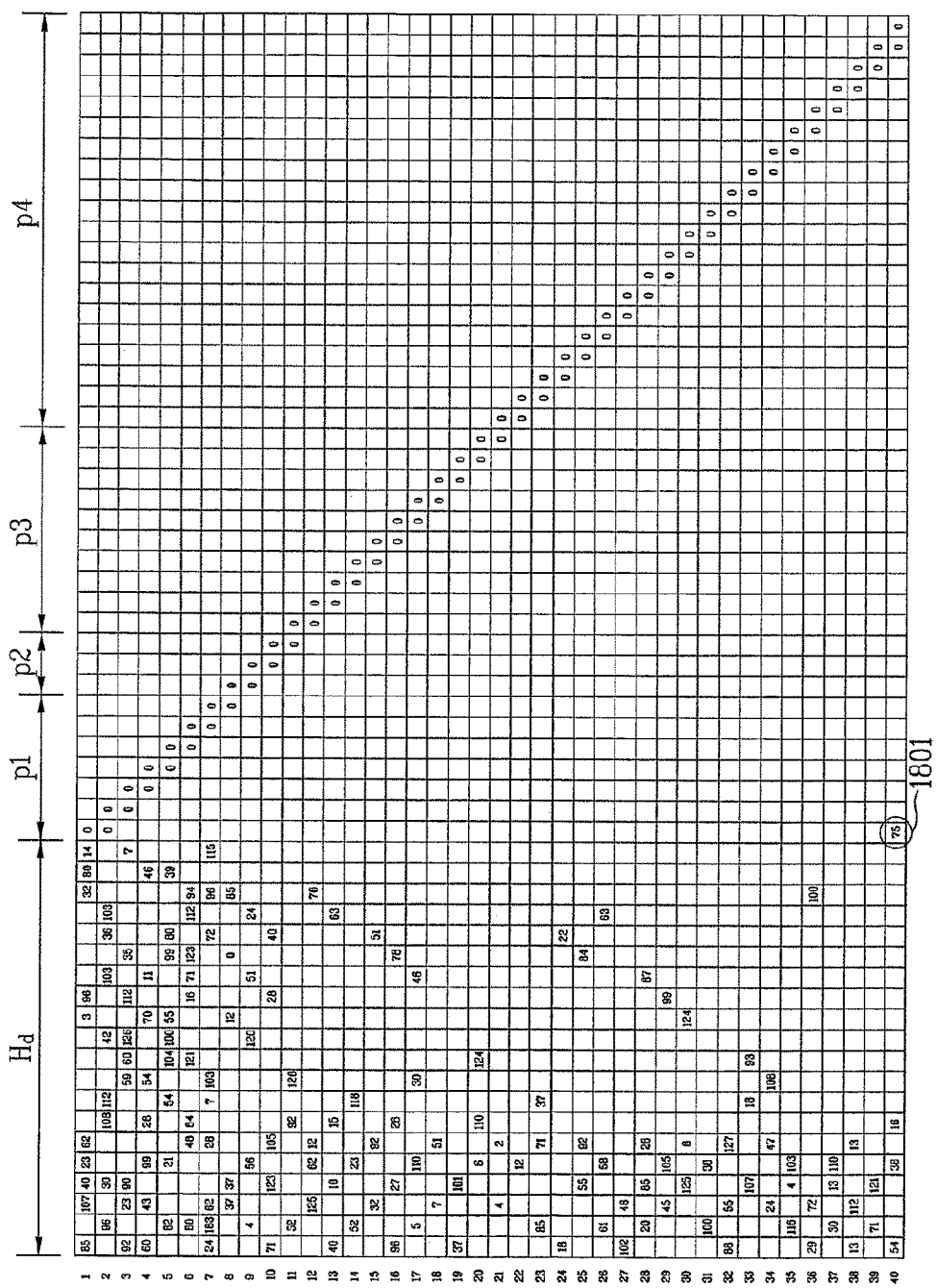
FIG. 18 to FIG. 19D illustrate an example of a parity check matrix according to another embodiment of the present invention.

FIG. 18 illustrates an example of a parity check matrix according to another embodiment of the present invention. The model matrix of FIG. 18 can be used for LDPC encoding and decoding. Also, as described above, encoding and decoding can be performed using the entire or some of the matrix of FIG. 18. If encoding and decoding are performed using the entire or some of the matrix of FIG. 18, the aforementioned IR method can be used for data transmission and reception.

Hereinafter, features of the model matrix of FIG. 18 will be described. The model matrix of FIG. 18 consists of a systematic part and a parity part. The parity part is preferably designed in accordance with the aforementioned lower triangle type. In this case, index more than 0 (i.e., shift number) is preferably given to the last row of the first column. In the example of FIG. 18, index of 75 is given to the region 1801. The index given to the region 1801 is preferably determined in accordance with the structure of the systematic part of the model matrix. In other words, if the structure of the systematic part is varied, the value of the index given to the region 1801 is varied. In other words, the index value of the region 1801 is variable. If the last row element of the first column of the parity part has index more than 0, performance is improved. This fact can easily be identified through an experiment which observes BER value.

If the last row element of the first column of the systematic part has index more than 0, performance is improved. This fact can easily be identified through an experiment which observes BER value.

Figure 19A:
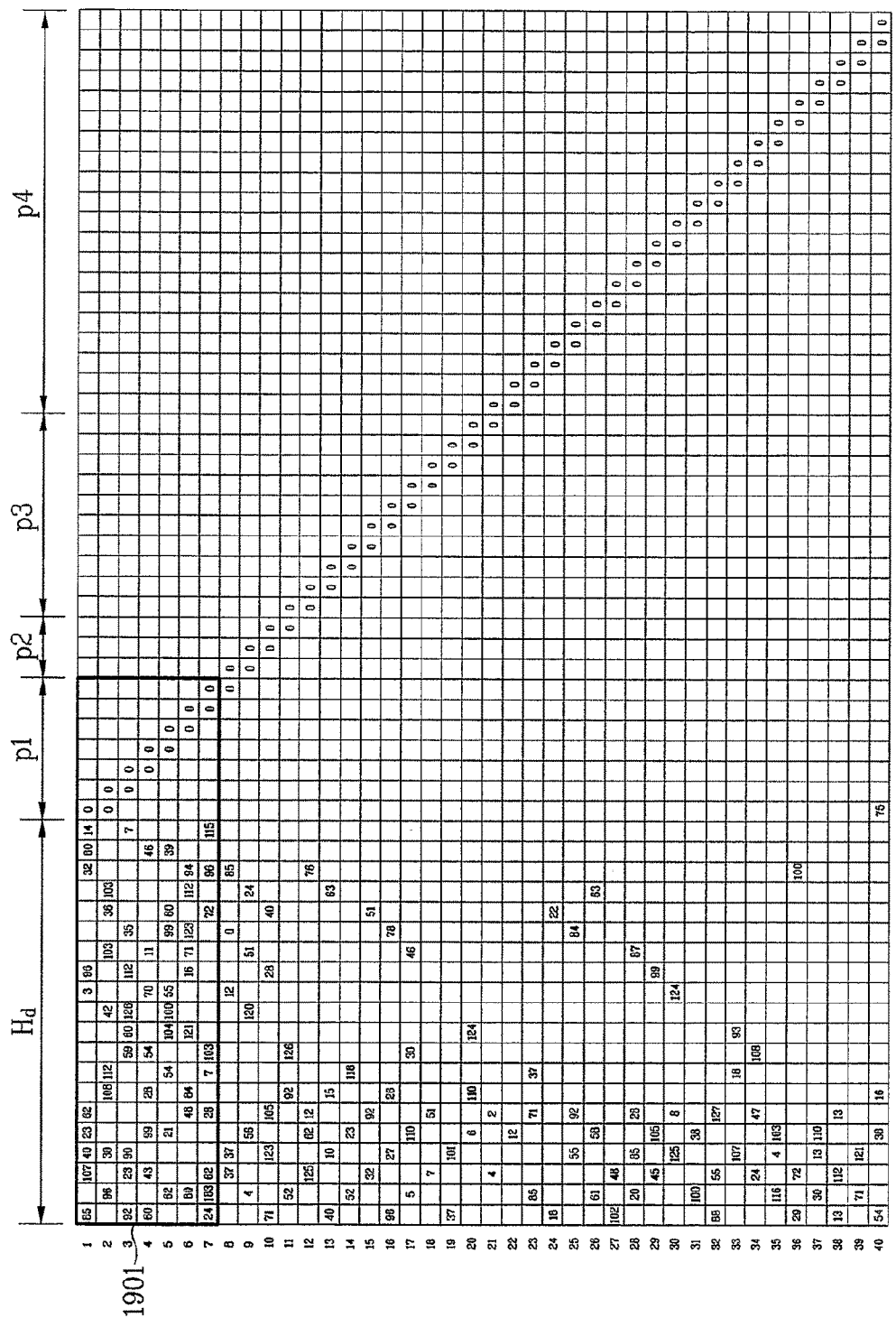
Figure 19C:
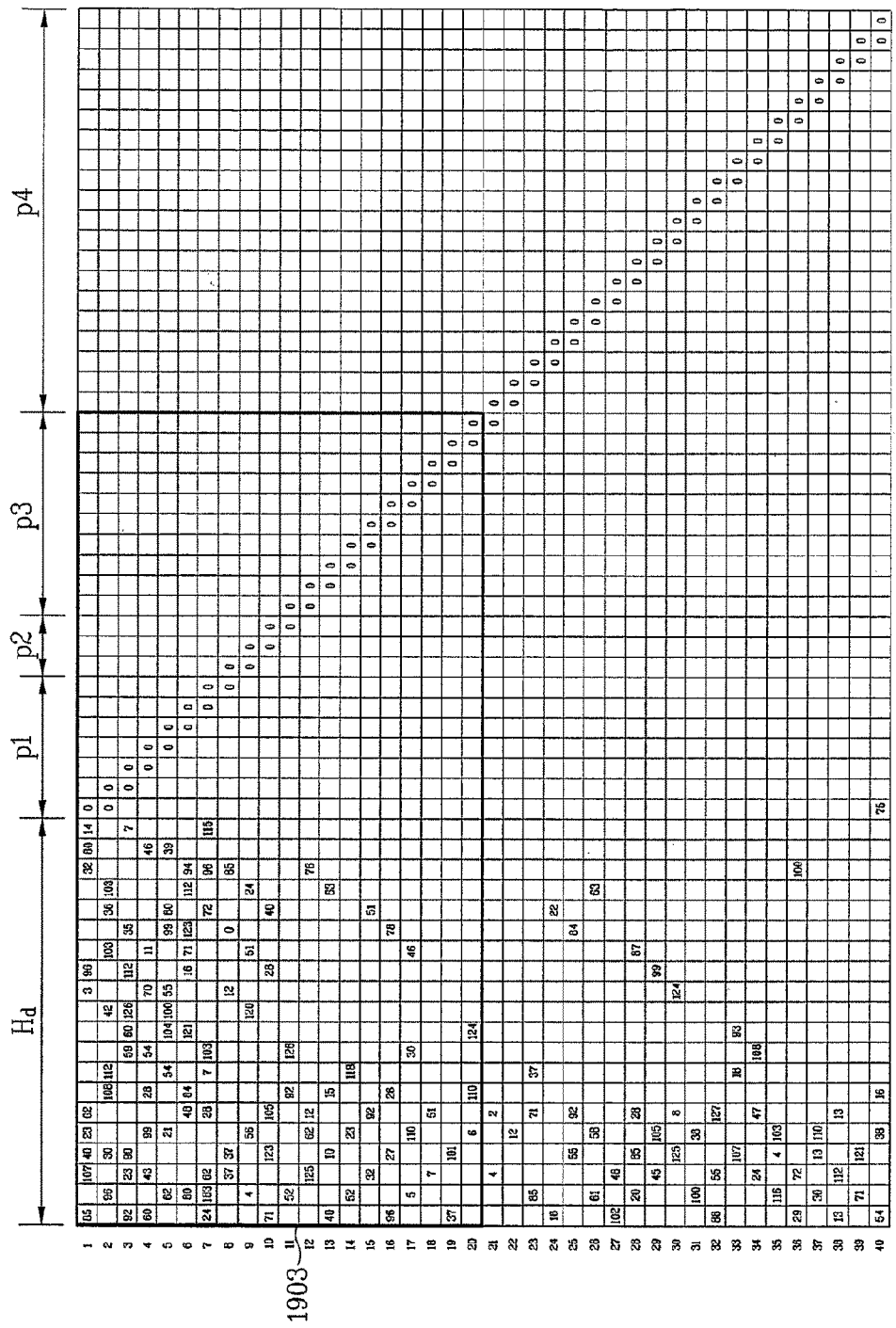
Figure 19D:
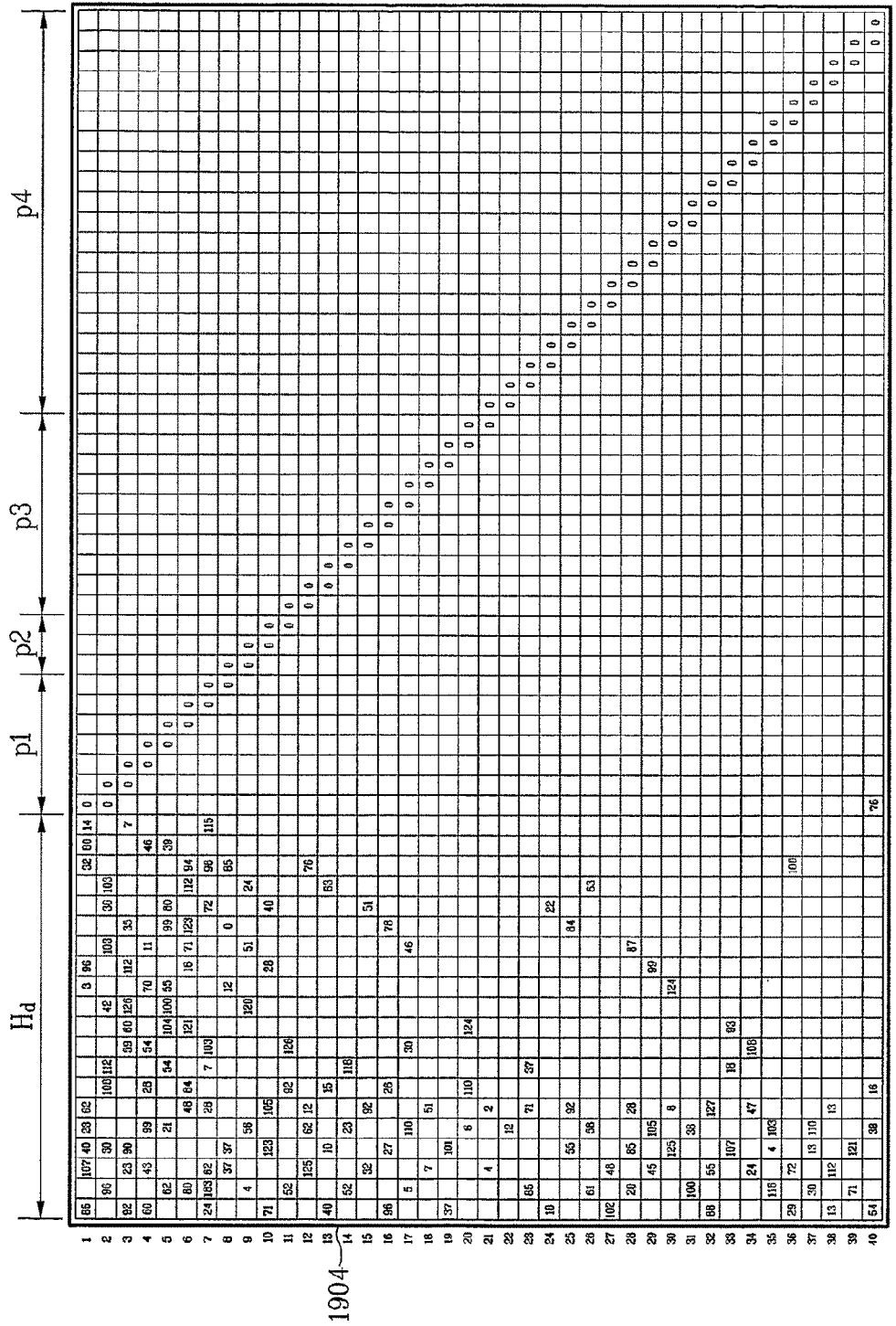

FIG. 19A to FIG. 19D illustrate an example of the model matrix of FIG. 18 applied to the IR method. As shown, the matrix of FIG. 18 can be classified into four parts corresponding to a specific coding rate. FIG. 19A is a block diagram illustrating encoding and decoding by the first matrix 1901 corresponding to a first coding rate. FIG. 19B is a block diagram illustrating encoding and decoding by the second matrix 1902 corresponding to a second coding rate. FIG. 19C is a block diagram illustrating encoding and decoding by the third matrix 1903 corresponding to a third coding rate. FIG. 19D is a block diagram illustrating encoding and decoding by the fourth matrix 1904 corresponding to a fourth coding rate.

In short, in case of the matrix of FIG. 18, additional index is included in the party part to improve performance. Also, the matrix of FIG. 18 is divided into a plurality of regions for use in encoding and decoding which support various coding rates. Also, the matrix of FIG. 18 can be used if the IR method is supported.

Figure 20:
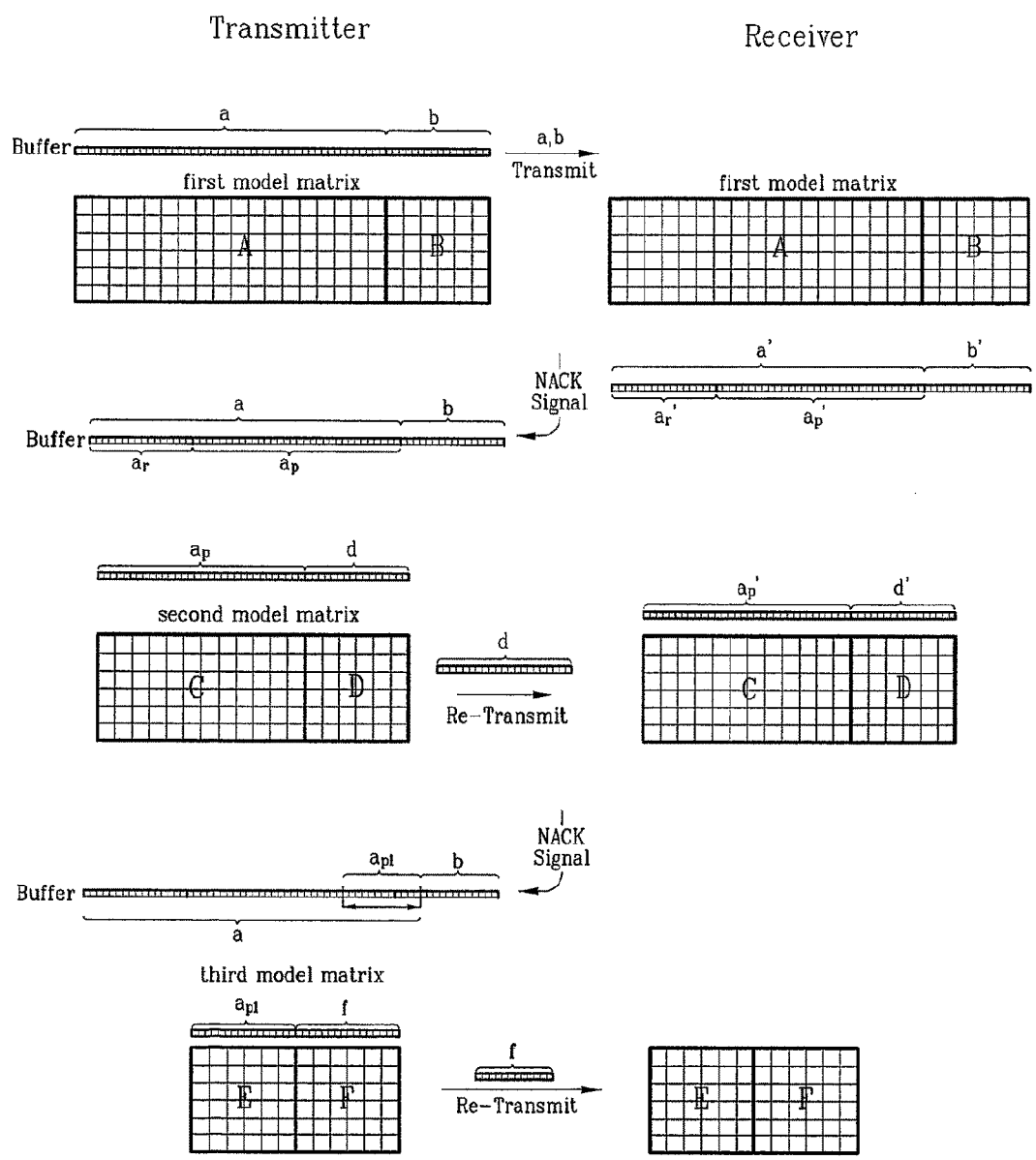
FIG. 20 illustrates a method of encoding data using LDPC according to another embodiment of the present invention.

FIG. 20 illustrates an LDPC encoding method according to another embodiment of the present invention. Each block of FIG. 20 means the sub-block. In other words, the encoding method of FIG. 20 is based on the model matrix. Since encoding according to the present invention can be performed by the model matrix or the parity check matrix, the present invention is not limited to the example of FIG. 20. Each block of FIG. 20 has a random index (i.e., shift number).

The encoding method according to this embodiment can be performed by a transmitter which includes different parity check matrixes. The transmitter includes the same parity check matrix or model matrix as that of a receiver which performs LDPC decoding, and can perform encoding by using this parity check matrix or model matrix.

The transmitter according to this embodiment performs encoding by using the first model matrix. The first model matrix includes a systematic part A corresponding to information bit sequence and a parity part B which generates parity bits. Hereinafter, the information bit sequence corresponding to the systematic part A of the first model matrix will be referred to as a first information bit sequence (a), and the parity bits generated by the parity part B of the first model matrix will be referred to as a first parity bit sequence (b). Since LDPC code is defined in a systematic form, the first information bit sequence (a) is included in the encoded codeword. In other words, the transmitter transmits the codeword including the first information bit sequence (a) and the first parity bit sequence (b) to the receiver. To transmit the encoded codeword, various modulation methods and various antenna methods can be used. Also, it is preferable that the transmitter according to this embodiment stores the first information bit sequence (a) in a separate memory area.

The receiver can acquire the codeword by receiving the signal transmitted from the transmitter. The first information bit sequence and the first parity bit sequence included in the codeword are distorted by channel. Accordingly, the codeword acquired by the receiver includes the distorted first information bit sequence (a') and the distorted first parity bit sequence (b'). The receiver performs syndrome test or CRC test for the distorted first information bit sequence (a') and the distorted first parity bit sequence (b'). Since error test and error correction can be performed for the LDPC code, decoding is performed to restore the distorted first information bit sequence (a') to the first information bit sequence (a) having no distortion. The receiver transmits ACK/NACK depending on the result of the syndrome test or the CRC test. In other words, the receiver transmits NACK to the transmitter if the syndrome test or the CRC test is failed.

The transmitter which has received NACK performs encoding by using the second model matrix. Also, if NACK is received, the transmitter performs encoding for the second information bit sequence ($a_p$) corresponding to a part of the first information bit sequence (a). As described above, since the transmitter stores the first information bit sequence in a separate memory area, the transmitter can acquire the first information bit sequence by accessing the memory area when performing decoding for retransmission. Although the transmitter encodes the information bit sequence corresponding to a part of the first information bit sequence (a), the transmitter performs encoding by using the second model matrix not the first model matrix.

The second model matrix includes a systematic part C corresponding to the information bit sequence and a parity part D which generates parity bit sequence. The second information bit sequence ($a_p$) corresponds to any part of the first information bit sequence (a), and corresponds to the systematic part C of the second model matrix one to one. The parity bit sequence generated by the parity part D of the second model matrix will be referred to as second parity bit (d).

The transmitter transmits the second parity bit sequence (d) to the receiver. In other words, the transmitter transmits the second parity bit sequence (d) as retransmission data in response to NACK transmitted from the receiver.

The receiver acquires the second parity bit sequence (d') distorted by a radio channel. The receiver performs decoding through the first part of the distorted first information bit sequence (a') stored in the memory and the distorted second parity bit sequence (d'). Hereinafter, the first part of the distorted first information bit sequence (a') will be expressed as $a_p$'. The distorted first information bit sequence (a') is divided into the part $a_p$' and the other part $a_r$'. The receiver decodes the part $a_p$' and the distorted second parity bit sequence (d') by using the second model matrix. The receiver transmits ACK/NACK to the transmitter in accordance with the result of the syndrome test or the CRC test. In other words, if the receiver fails to successfully decode the data received from the transmitter, the receiver transmits NACK to the transmitter. If the receiver successfully decodes the received data, the receiver transmits ACK to the transmitter.

The transmitter which has received NACK encodes the third information bit sequence by using the third model matrix. The third information bit sequence is a part of the first information bit sequence (a) or the second information bit sequence ($a_p$). If the second information bit sequence $a_p$ is divided into the part $a_{p0}$ and the part $a_{p1}$ depending on a predetermined rule, the third information bit sequence could be the part $a_{p1}$. The third model matrix consists of a systematic part E and a parity part F which correspond to the third information bit sequence. The transmitter encodes the third information bit sequence by using the third model matrix, and transmits the third parity bit sequence (f) of the encoded third information bit sequence to the receiver. The receiver acquires the distorted third parity bit sequence (f') during the transmission procedure.

In this embodiment, the third model matrix is used separately from the first model matrix and the second model matrix. In other words, a part of any one of a plurality of model matrixes used in this embodiment may be different from any one of the other of the model matrixes.

The receiver performs decoding by using the third model matrix. As described above, the receiver performs decoding by using the second part of the distorted first information bit sequence (a') and the distorted third parity bit sequence (f'). As described above, the distorted first information bit sequence (a') is divided into the part $a_p$' and the other part $a_r$' depending on a predetermined rule. Also, the part $a_p$' can be divided into the part $a_{p0}$' and the part $a_{p1}$' depending on a predetermined rule. In this case, the second part of the distorted first information bit sequence (a') will be referred to as $a_{p1}$'.

The receiver decodes the part $a_{p1}$' and the distorted third parity bit sequence (d') by using the third parity check matrix. The receiver transmits ACK/NACK to the transmitter in accordance with the decoded result.

In the embodiment of FIG. 20, the transmitter uses three parity check matrixes. Also, if the transmitter performs encoding by using each of the parity check matrixes, the transmitter again performs encoding by selecting a part of the first information bit sequence (a) which is initially transmitted. A method of selecting a part of the first information bit sequence (a) depends on a predetermined rule. The predetermined rule is also used for the method of selecting information bit sequence when the receiver performs decoding.

The encoding method according to this embodiment is advantageous in that it can be used even though the first model matrix and the second model matrix are separate matrixes. In other words, this embodiment can be used even though the second model matrix is a part of the first model matrix or the first model matrix is not a part of the second model matrix. Also, this embodiment can be used even though the first model matrix and the second model matrix do not include the same parity part. Moreover, this embodiment can be used even though the first model matrix has a size the same as or different from that of the second model matrix.

Hereinafter, embodiments of the method of selecting the information bit sequence used in encoding for retransmission will be described.

Figure 21:
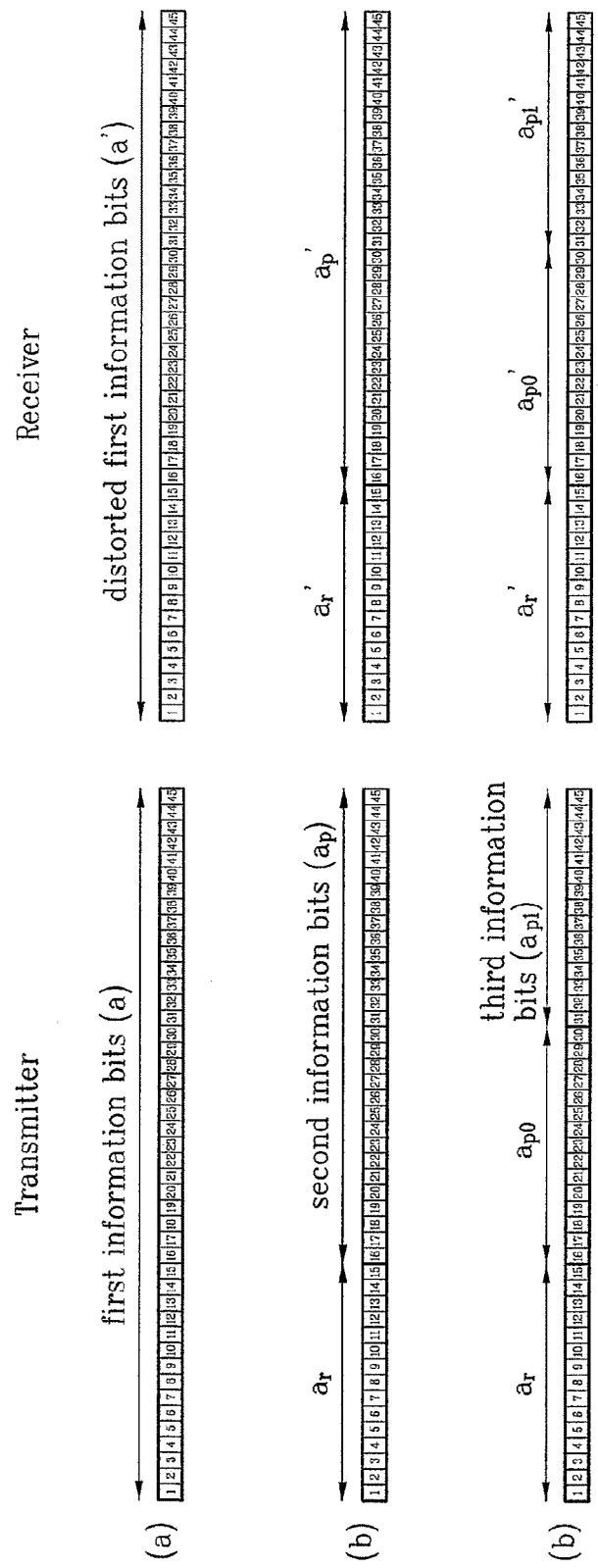
FIG. 21 illustrates a method of selecting information bit sequence used when encoding and decoding are performed in accordance with the embodiment of FIG. 20.

FIG. 21 illustrates a method of selecting the information bit sequence used when encoding and decoding are performed in accordance with the embodiment of FIG. 20.

FIG. 21 illustrates information bit sequence of 45 bits transmitted from the transmitter and distorted information bit sequence of 45 bits received in the receiver. The receiver can classify the distorted information bit sequence of 45 bits as shown in FIG. 21A, FIG. 21B and FIG. 21C. Also, the transmitter can classify the information bit sequence of 45 bits as shown in FIG. 21A, FIG. 21B and FIG. 21C. Namely, FIG. 21 illustrates three methods of classifying the information bit sequence of 45 bits transmitted and received between the transmitter and the receiver.

As shown in FIG. 21A, the transmitter which first transmits data classifies the entire of the information bit sequence of 45 bits to be transmitted, into the first information bit sequence (a) and performs encoding for the first information bit sequence (a). If parity bits (not shown) are generated in accordance with the result of the encoding, the transmitter transmits the first information bit sequence and its parity bits to the receiver. The receiver classifies the entire of the received information bit sequence into the distorted first information bit sequence (a') and performs decoding.

If the transmitter receives NACK from the receiver, the transmitter selects a part of the information bit sequence of 45 bits to be transmitted as the second information bit sequence ($a_p$) as shown in FIG. 21B and performs encoding for the selected part. Also, the transmitter retransmits parity bits (not shown) of the second information bit sequence ($a_p$) to the receiver. The receiver selects the part $a_p'$ of the initially received information bit sequence of 45 bits as shown in FIG. 21B and performs decoding for the selected bit and the retransmitted parity bits. If the syndrome test or the CRC test is failed, the receiver transmits NACK to the transmitter.

If the transmitter receives NACK, the transmitter selects a part of the information bit sequence of 45 bits to be transmitted as the third information bit sequence ($a_p$) as shown in FIG. 21C and performs encoding for the selected part. Also, the transmitter retransmits parity bits (not shown) of the third information bit sequence ($a_p$) to the receiver. The receiver selects the part $a_p'$ of the initially received information bit sequence of 45 bits as shown in FIG. 21C and performs decoding for the selected bit and the retransmitted parity bits.

The rule for determining the information bit sequence used for the multi-level encoding procedure of the transmitter is the same as the rule for determining the information bit sequence used for the multi-level decoding procedure of the receiver. As shown in FIG. 21, if the transmitter performs encoding for the second information bit sequence ($a_p$) and transmits the encoded data, the receiver reads out the part $a_p'$ corresponding to the second information bit sequence of the part a' stored in the memory. Also, if the transmitter performs encoding for the third information bit sequence ($a_{p1}$) and transmits the encoded data, the receiver reads out the part $a_{p1}'$ corresponding to the third information bit sequence of the part a' stored in the memory.

The three methods shown in FIG. 21 can be determined in accordance with the parity check matrix. In other words, if decoding is performed using the first parity check matrix, the distorted information bit is selected in accordance with the method of FIG. 21A to perform decoding. Also, if decoding is performed using the second parity check matrix, the distorted information bit is selected in accordance with the method of FIG. 21B to perform decoding.

Although the parity check matrixes used for encoding of the information bit sequence of FIGS. 21A, 21B and 21C may be different from one another, since the transmitter and the receiver know the position of the information bit sequence used for encoding and decoding, the receiver can perform decoding by using only the retransmitted parity bits even though the transmitter retransmits the parity bits without retransmitting the information bit sequence.

Since the example of FIG. 21 is only exemplary to describe this embodiment, the present invention is not limited to such example. In other words, the information bit sequence can freely be selected for the multi-level encoding. Hereinafter, FIG. 22 and FIG. 23 illustrate examples of various methods of selecting the information bit sequence.

Figure 22:
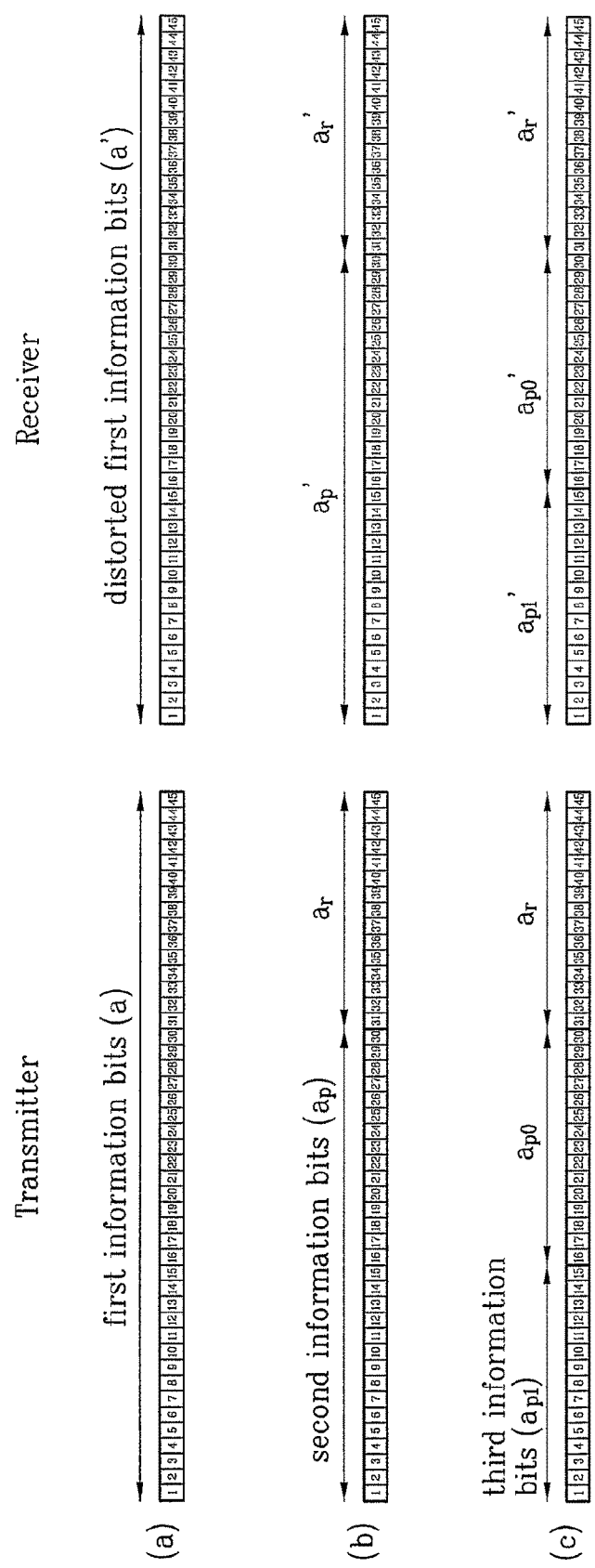
FIG. 22 illustrates another method of selecting information bit sequence used when encoding and decoding are performed in accordance with the embodiment of the present invention.

FIG. 22 illustrates another example of a method of selecting the information bit sequence used when encoding and decoding are performed in accordance with the embodiment of the present invention.

FIG. 22 illustrates another example of classifying the information bit sequence of 45 bits into three methods. In other words, if the receiver receives the entire part of 45 bits (a') and its corresponding first parity bits (not shown), the receiver decodes the part a' and the parity bits and transmits ACK/NACK. If NACK is transmitted, the receiver receives second parity bits (not shown) generated by the part $a_p$ of FIG. 22B and decodes the second parity bits and the part $a_p'$ of FIG. 22B.

Figure 23:
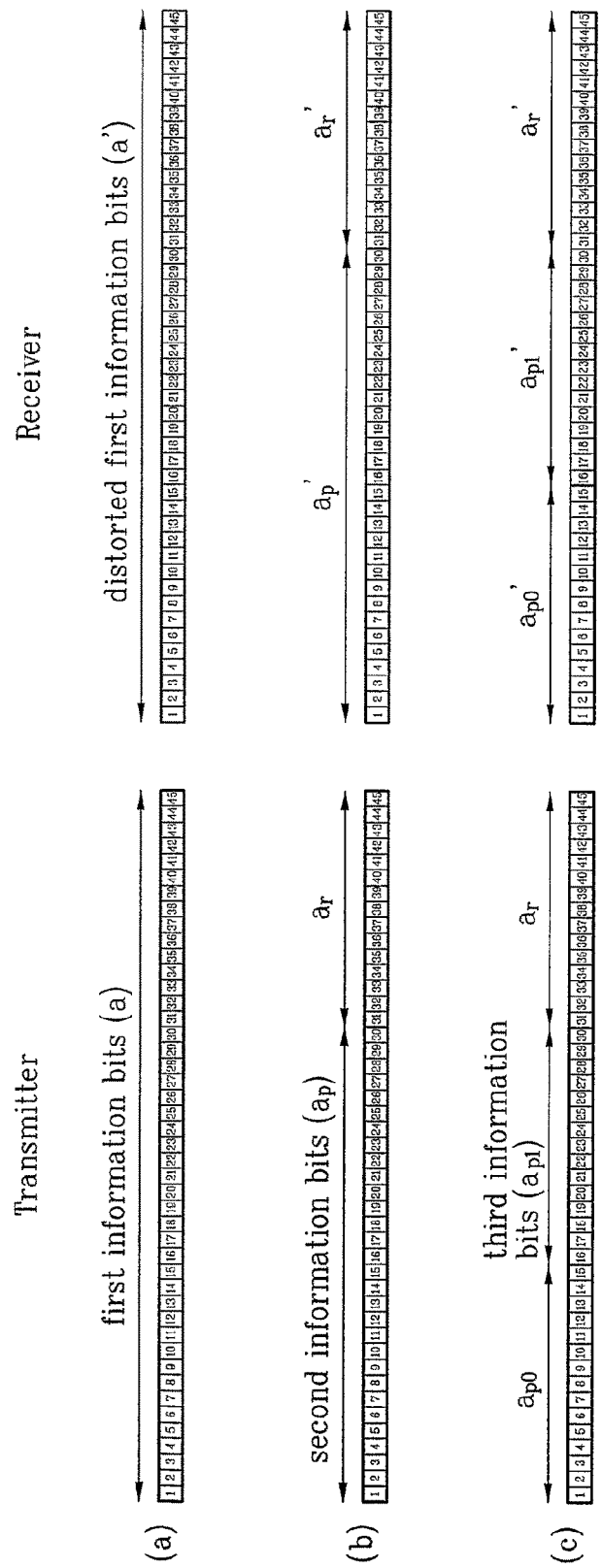
FIG. 23 illustrates other method of selecting information bit sequence used when encoding and decoding are performed in accordance with the embodiment of the present invention.

FIG. 23 illustrates another example of a method of selecting the information bit sequence used when encoding and decoding are performed in accordance with the embodiment of the present invention.

In accordance with the embodiment of FIG. 23, the transmitter performs decoding by using information bit sequence different from that of the related art.

As described above, the transmitter can include various kinds of model matrixes. However, it is preferable that a plurality of parity check matrixes used in the transmitter have different coding rates. Referring to the example of FIG. 20, decoding is performed using the first model matrix to the third model matrix. The first model matrix corresponds to the first coding rate, the second model matrix corresponds to the second coding rate, and the third model matrix corresponds to the third coding rate.

Figure 24:
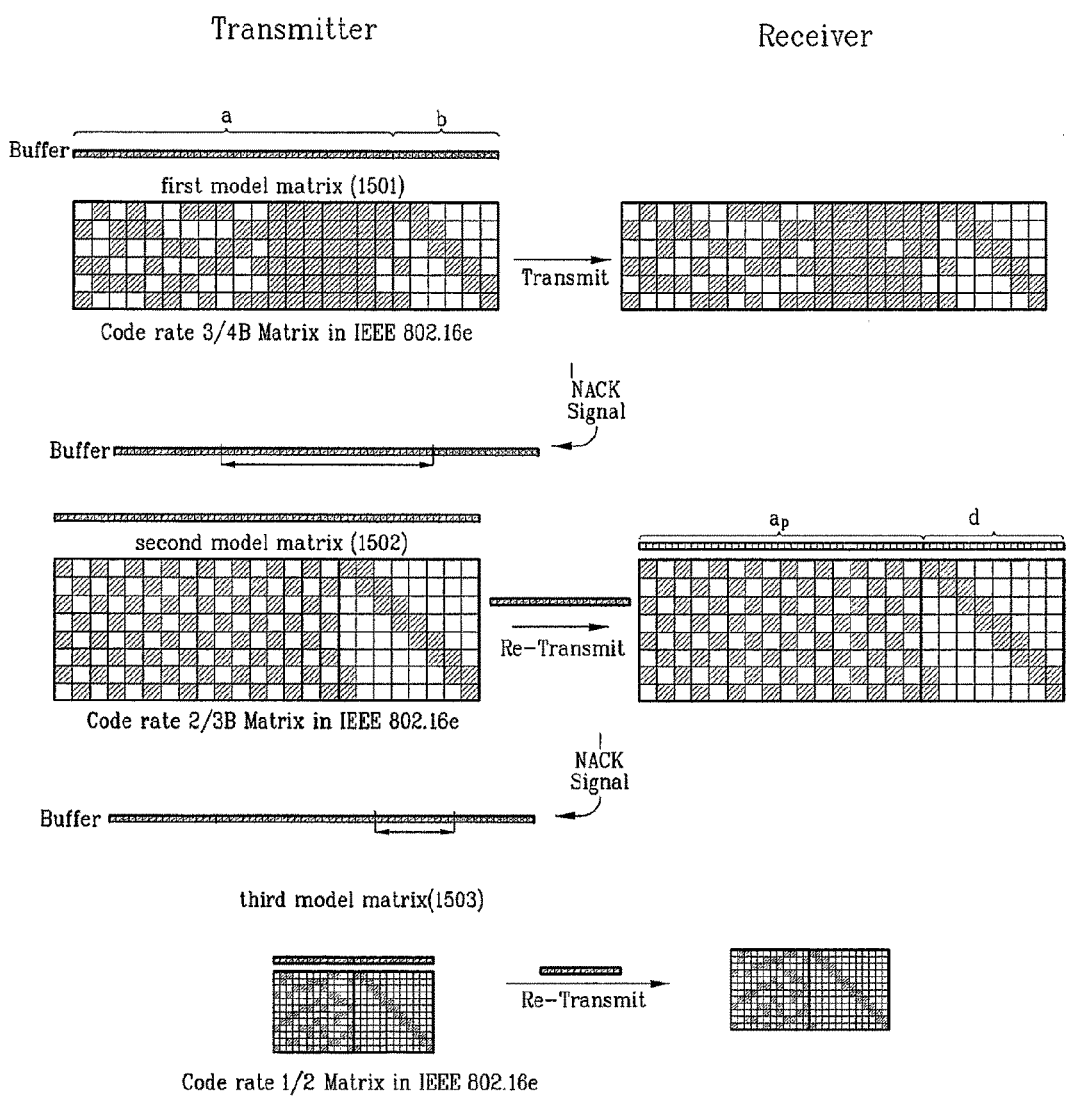
FIG. 24 is a block diagram illustrating a method of performing encoding using a model matrix adopted in the IEEE 802.16e standard which is suggested in the related art.

Furthermore, in this embodiment, the model matrix adopted in the IEEE 802.16e standard which is suggested in the related art can be used. FIG. 24 is a block diagram illustrating a method of performing encoding using a model matrix adopted in the IEEE 802.16e standard which is suggested in the related art.

In the embodiment of FIG. 24, the transmitter performs encoding by using the first matrix 1501 corresponding to a coding rate of 3/4. The codeword encoded by the first matrix 1501 is transmitted to the receiver. The receiver performs decoding, and transmits NACK to the transmitter if decoding is failed. Afterwards, the transmitter retransmits the parity bits only without transmitting the information bit sequence. If retransmission is performed, the transmitter changes the coding rate of 3/4 to the coding rate of 2/3 to allow the receiver to perform decoding well. The receiver performs decoding by using the second matrix 1502. If decoding is failed, the receiver can transmit NACK to the transmitter to request encoding of a lower coding rate (coding rate of 1/2). The transmitter which has received NACK can perform encoding by using the third matrix 1503 at the coding rate of 1/2.

According to the retransmission method shown in FIG. 24, the transmitter first transmits the codeword at a high coding rate, and if NACK is received, retransmits the parity bits only. In other words, the transmitter retransmits the parity bits only, and the receiver receives the retransmitted results together. In other words, if NACK is received, the transmitter transmits a signal corresponding to a low coding rate. As a result, according to this embodiment, the same advantage as that of the related art IR method can be obtained.

Figure 25A:
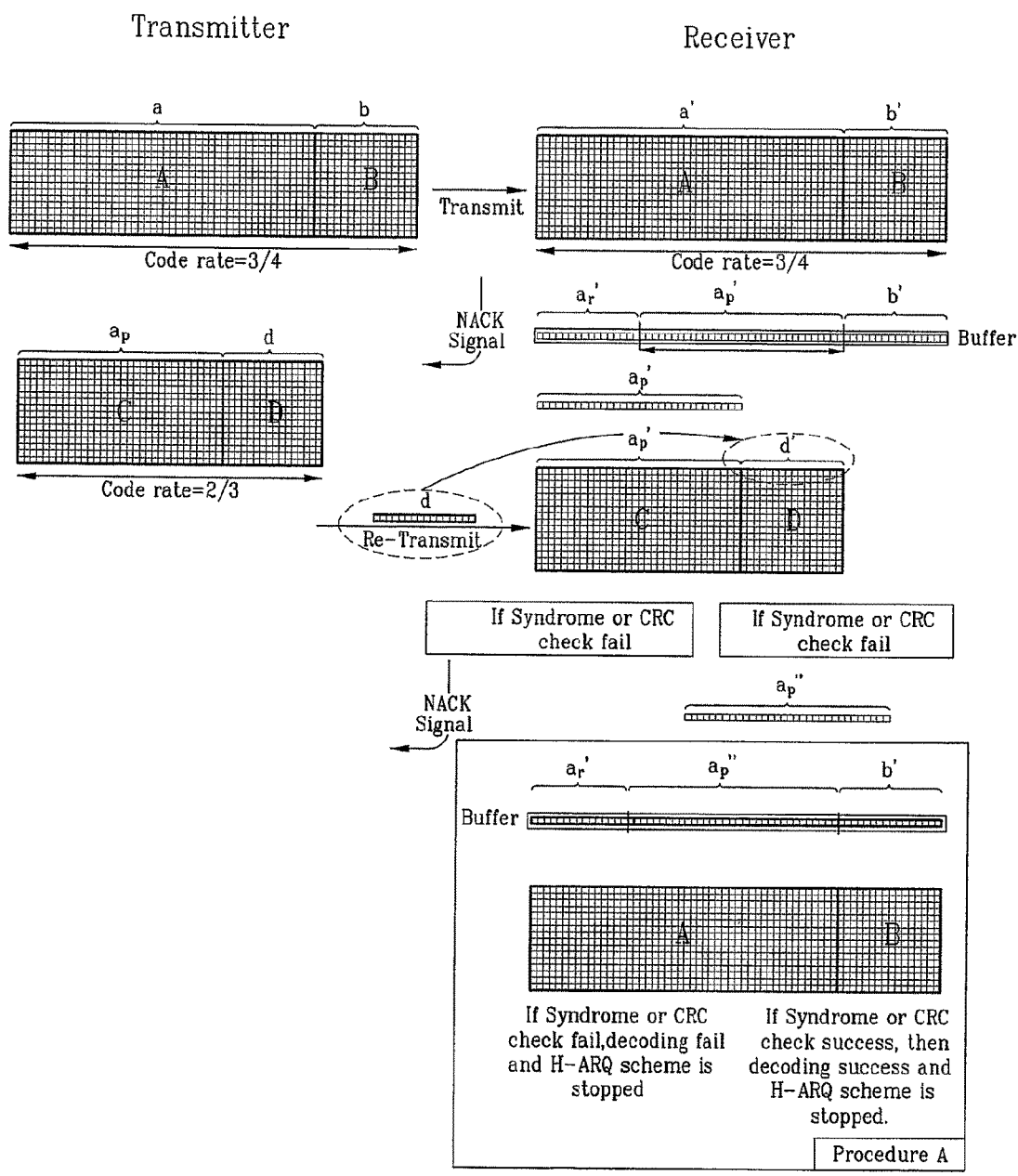
FIG. 25A to FIG. 25C illustrate a method of performing encoding in accordance with the embodiment of the present invention.
Figure 25B:
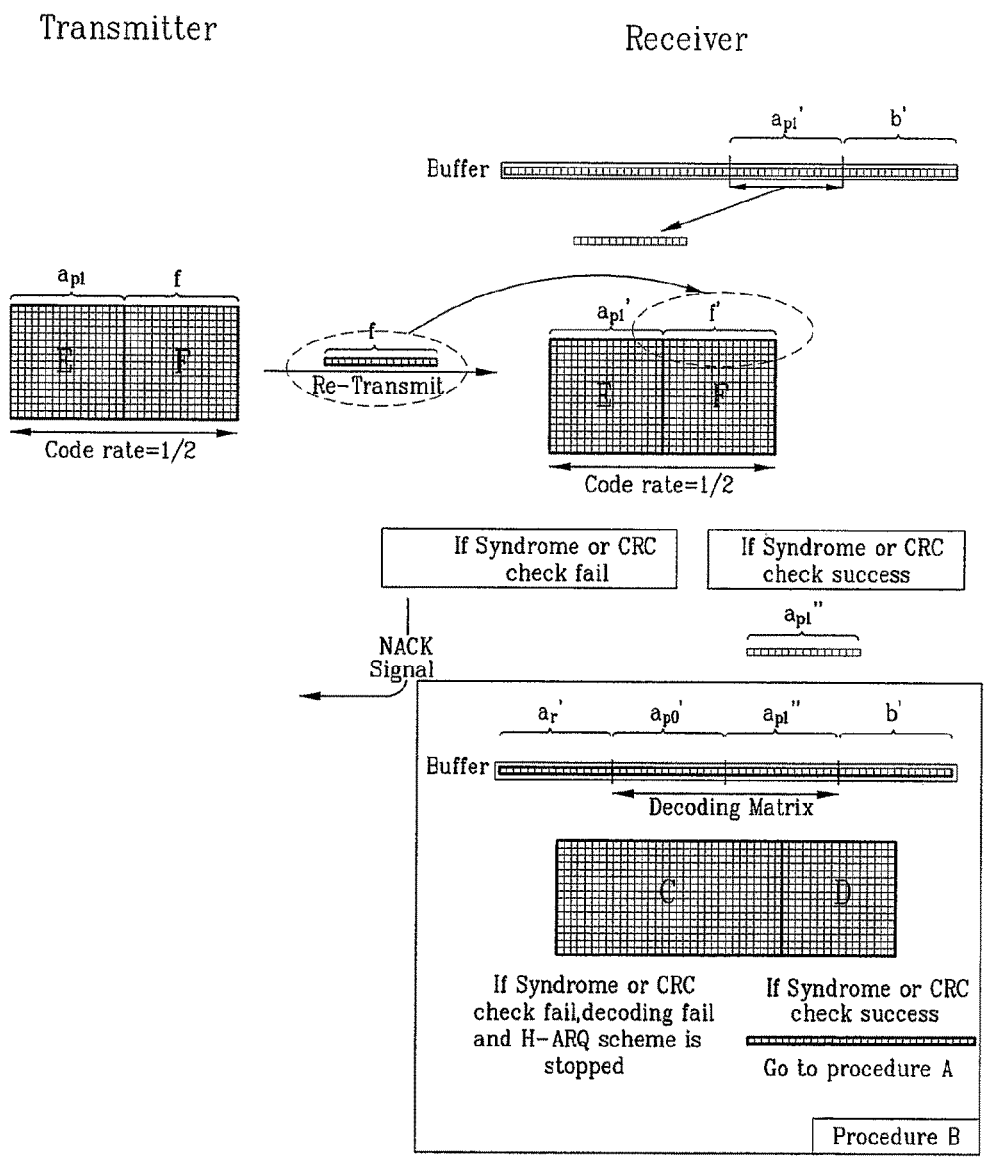
Figure 25C:
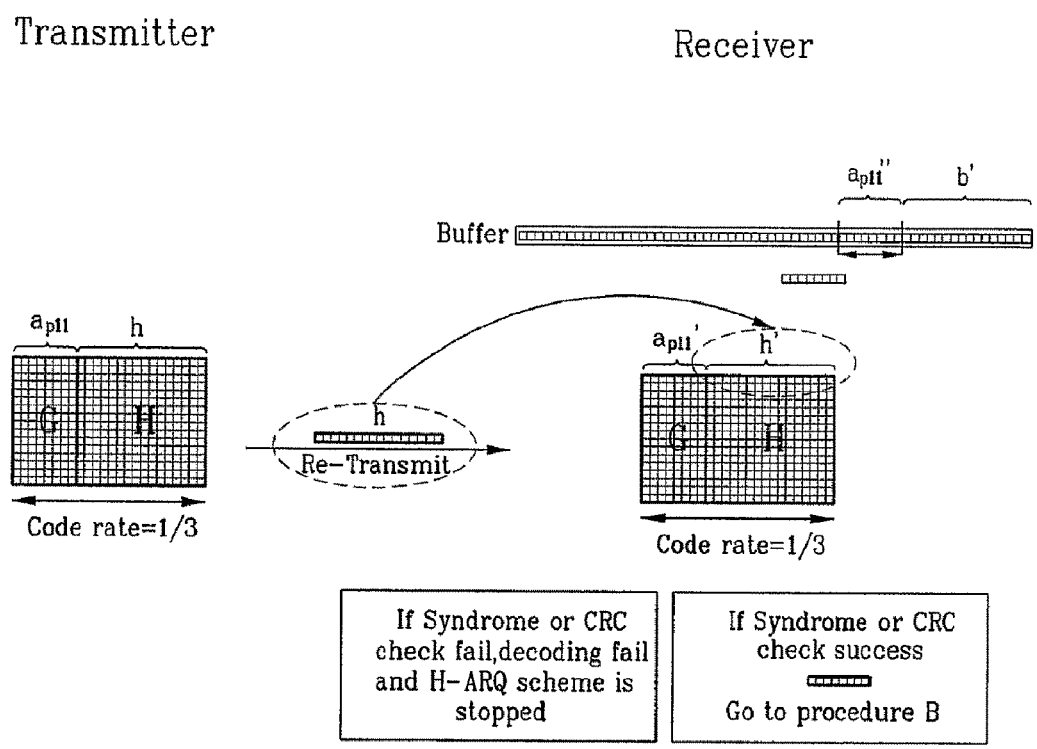

FIG. 25A to FIG. 25C illustrates a method of performing decoding in accordance with the embodiment of the present invention. Each block of FIG. 25A to FIG. 25C means the sub-block. In other words, the decoding method of FIG. 25A to FIG. 25C is based on the model matrix. Since decoding according to the present invention can be performed by the model matrix or the parity check matrix, the present invention is not limited to the example of FIG. 25A to FIG. 25C. Each block of FIG. 25A to FIG. 25C has a random index (i.e., shift number).

The decoding method according to this embodiment can be performed by a receiver which includes different parity check matrixes. The receiver includes the same parity check matrix or model matrix as that of the transmitter which performs LDPC encoding, and performs decoding by using this parity check matrix or model matrix.

Referring to FIG. 25A, the transmitter performs encoding by using the first model matrix. The first model matrix includes a systematic part A corresponding to information bit sequence one to one and a parity part B which generates parity bits. Hereinafter, the information bit sequence corresponding to the systematic part A of the first model matrix will be referred to as a first information bit sequence (a), and the parity bits generated by the parity part B of the first model matrix will be referred to as a first parity bit sequence (b). The transmitter transmits the codeword including the first information bit sequence (a) and the first parity bit sequence (b) to the receiver. To transmit the codeword, data processing procedures such as symbol mapping, modulation, interleaving, and frequency conversion can be performed, and the codeword can be transmitted to the receiver by various antenna methods.

The receiver can acquire the codeword by receiving the signal transmitted from the transmitter. The first information bit sequence and the first parity bit sequence included in the codeword are distorted by channel. Accordingly, the codeword acquired by the receiver includes the distorted first information bit sequence (a') and the distorted first parity bit sequence (b'). Preferably, the receiver stores the distorted first information bit sequence (a') and the distorted first parity bit sequence (b') in a separate memory. The receiver performs the syndrome test or the CRC test for the distorted first information bit sequence (a') and the distorted first parity bit sequence (b') to check whether they have error. Since error test and error correction can be performed for the LDPC code, decoding is performed to restore the distorted first information bit sequence (a') to the first information bit sequence (a) having no distortion. The receiver transmits NACK to the transmitter if the syndrome test or the CRC test is failed.

The transmitter which has received NACK performs encoding by using the second model matrix. The transmitter initially performs encoding for the first information bit sequence (a). After receiving NACK, the transmitter tries to perform encoding for the second information bit sequence ($a_p$) corresponding to any part of the first information bit sequence (a). The second matrix includes a systematic part C corresponding to the second information bit sequence and a parity part D which generates parity bits. The second information bit sequence ($a_p$) corresponds to any part of the first information bit sequence (a), and corresponds to the systematic part C of the second model matrix one to one. The parity bit sequence generated by the parity part D of the second model matrix will be referred to as second parity bit (d).

The transmitter transmits the second parity bit sequence (d) to the receiver. In other words, the transmitter transmits only the second parity bit sequence (d) as retransmission data in response to NACK transmitted from the receiver.

As described above, the receiver stores the distorted first information bit sequence (a') in the separate memory. The receiver performs decoding through the first part of the distorted first information bit sequence (a') stored in the memory and the distorted second parity bit sequence (d'). Hereinafter, the first part of the distorted first information bit sequence (a') will be expressed as $a_p$'. The distorted first information bit sequence (a') is divided into the part $a_p$' and the other part $a_r$'. The receiver decodes the part $a_p$' and the distorted second parity bit sequence (d') by using the second model matrix. If the receiver successfully performs decoding, i.e., if the receiver successfully performs error test or CRC test, the receiver performs the procedure A of FIG. 25A. By contrast, if the receiver fails to successfully perform decoding, the receiver transmits NACK to the transmitter.

The procedure A is performed when decoding is successfully performed by the second matrix. Since error test and error correction can be performed for the LDPC code, the part $a_p$' is corrected to a part $a_p$" through decoding. Since the part $a_p$" corresponds to bits which are successfully decoded, it may be referred to as a known value. On the other hand, since the part $a_p$' corresponds to bits which are not successfully decoded, it may be referred to as an unknown value. In the procedure A, decoding is again performed for the distorted first information bit sequence (a'). However, if decoding is performed for the distorted first information bit sequence (a'), the same result is obtained. Accordingly, decoding is performed for the part $a_r$' corresponding to the unknown value and the part $a_p$" corresponding to the known value. In short, in the procedure A, decoding is performed by the first matrix for the part $a_p$" and the part b'.

If decoding is successfully performed through the procedure A, since the receiver restores the first information bit sequence (a) initially transmitted from the transmitter, the retransmission procedure is ended. If decoding performed through the procedure A is failed, since the receiver cannot restore the first information bit sequence (a) initially transmitted from the transmitter, the retransmission procedure is stopped. If the procedure A is failed, encoding and decoding are preferably performed by the matrix other than the first matrix.

Hereinafter, the case where the receiver transmits NACK to the transmitter as decoding performed by the second matrix is failed will be described with reference to FIG. 25B.

The transmitter encodes the third information bit sequence by using the third matrix.

The third information bit sequence is a part of the first information bit sequence (a) or the second information bit sequence ($a_p$). If the second information bit sequence $a_p$ is divided into the part $a_{p0}$ and the part $a_{p1}$ depending on a specific rule, the third information bit sequence could be the part $a_{p1}$. The third matrix consists of a systematic part E and a parity part F which correspond to the third information bit sequence. The transmitter transmits the third information bit sequence (f) encoded by using the third matrix to the receiver. The receiver acquires the distorted third parity bit sequence (f').

The receiver performs decoding by using the third matrix. As described above, the receiver stores the distorted first information bit sequence (a') in the separate memory. The receiver performs decoding through the second part of the distorted first information bit sequence (a') and the distorted third parity bit sequence (f'). As described above, the distorted first information bit sequence (a') is divided into the part $a_p'$ and the other part $a_r'$ depending on a predetermined rule. Also, the part $a_p'$ can be divided into the part $a_{p0}'$ and the part $a_{p1}'$ depending on a predetermined rule. In this case, the second part of the distorted first information bit sequence (a') will be referred to as $a_{p1}'$.

The receiver decodes the part $a_{p1}'$ and the distorted third parity bit sequence (d') by using the third matrix. If the receiver successfully performs decoding, the receiver performs the procedure B of FIG. 25B. By contrast, if the receiver fails to successfully perform decoding, the receiver transmits NACK to the transmitter.

The procedure B is performed when decoding is successfully performed by the third matrix. In this case, the part $a_p'$ is corrected to a part $a_{p1}''$ through decoding in accordance with error correction characteristic of the LDPC code. Since the part $a_{p1}''$ corresponds to bits which are successfully decoded, it may be referred to as a known value. On the other hand, since the part $a_{p1}'$ corresponds to bits which are not successfully decoded, it may be referred to as an unknown value. In the procedure B, decoding is again performed for the part ($a_p'$).

However, if decoding is performed for the distorted first information bit sequence ($a_p'$), the same result is obtained. Accordingly, decoding is performed for the part $a_{p0}'$ corresponding to the unknown value and the part $a_{p1}''$ corresponding to the known value. In short, in the procedure B, decoding is performed by the second matrix for the part $a_{p0}'$, the part $a_{p1}''$ and the part d'.

If decoding is successfully performed through the procedure B, the receiver restores the part $a_p'$. As described above, since the distorted first information bit sequence (a') can be divided into the part $a_p'$ and the part $a_r'$, if the receiver restores the part $a_r'$, it can restore the entire of the distorted first information bit sequence a'. Accordingly, the receiver again performs the procedure A of FIG. 25A. In other words, decoding is performed by the first matrix for the information bit sequence restored through the procedure B and the part $a_r'$ and the part b' stored in the memory.

If decoding performed through the procedure B is failed, since the receiver cannot restore the first information bit sequence (a) initially transmitted from the transmitter, the retransmission procedure is stopped.

Hereinafter, the case where the receiver transmits NACK to the transmitter as decoding performed by the third matrix is failed will be described with reference to FIG. 25C.

The transmitter encodes the fourth information bit sequence by using the fourth matrix. The fourth information bit sequence is a part of the first information bit sequence or the part ($a_{p1}$). If the part $a_{p1}$ is divided into the part $a_{p10}$ and the part $a_{p11}$ depending on a predetermined rule, the fourth information bit sequence could be the part $a_{p11}$. The fourth matrix consists of a systematic part G and a parity part H which correspond to the fourth information bit sequence. The transmitter transmits the fourth parity bit sequence (h) encoded by using the fourth matrix to the receiver. The receiver acquires the distorted fourth parity bit sequence (h').

The receiver performs decoding by using the fourth matrix. As described above, the receiver stores the distorted first information bit sequence (a') in the separate memory. The receiver performs decoding through the third part of the distorted first information bit sequence (a') and the distorted fourth parity bit sequence (h'). As described above, the distorted first information bit sequence (a') is divided into the part $a_p'$ and the other part $a_r'$ depending on a specific rule. Also, the part $a_p'$ can be divided into the part $a_{p0}'$ and the part $a_{p1}'$ depending on a predetermined rule. Also, the part $a_{p1}'$ can be divided into the part $a_{p10}'$ and the part $a_{p11}'$ depending on a predetermined rule. In this case, the third part of the distorted first information bit sequence (a') will be referred to as $a_{p11}'$.

The receiver decodes the part $a_{p11}'$ and the distorted fourth parity bit sequence (h') by using the fourth matrix. If the receiver successfully performs decoding, the receiver performs the procedure B of FIG. 25B. By contrast, if the receiver fails to successfully perform decoding, it is determined that normal reception is impossible and thus the retransmission procedure is stopped.

In FIG. 25A to FIG. 25C, the receiver uses four parity check matrixes. Also, if the receiver performs decoding by using each of the parity check matrixes, the receiver performs decoding by selecting a part of the distorted information bit sequence (a') which is initially received. A method of selecting a part of the distorted information bit sequence (a') depends on a predetermined rule. The predetermined rule is also used for the method of selecting information bit sequence used when the parity bit sequence retransmitted from the transmitter is generated.

Hereinafter, a method of selecting a party of the initially received distorted information bit sequence (a') will be described.

FIG. 26 illustrates a method of selecting the information bit sequence used when encoding and decoding are performed in accordance with the embodiment of the present invention.

The example of FIG. 26 illustrates distorted information bit sequence of 45 bits received in the receiver and information bit sequence of 45 bits transmitted from the transmitter. The receiver can classify the distorted information bit sequence of 45, bits as shown in FIG. 26A, FIG. 26B, FIG. 26C and FIG. 26D. Also, the transmitter can classify the information bit sequence of 45 bits as shown in FIG. 26A, FIG. 26B, FIG. 26C and FIG. 26D. Namely, FIG. 26 illustrates four methods of classifying the information bit sequence of 45 bits transmitted and received between the transmitter and the receiver.

As shown in FIG. 26A, if the transmitter transmits the first information bit sequence (a) and transmits its parity bit sequence (not shown), the receiver receives the parity bits sequence to decode the distorted first information bit sequence (a'). After transmitting NACK as the receiver fails to decode the distorted first information bit sequence (a'), if the transmitter performs retransmission, the receiver decodes the retransmitted bit and the part $a_p'$ as shown. In other words, the receiver selects the part $a_p'$ of the part a' and decodes the selected part. Also, after transmitting NACK as the receiver fails to decode the part $a_p'$, if the transmitter performs retransmission, the receiver decodes the retransmitted bits and the part $a_{p1}'$. Also, after transmitting NACK as the receiver fails to decode the part $a_{p1}'$, if the transmitter performs retransmission, the receiver decodes the retransmitted bits and the part $a_{p11}'$ as shown.

The receiver stores the distorted first information bit sequence (a') in the memory provided in the receiver, and accesses the memory when each decoding is performed, to use a part of the first information bit sequence (a').

The rule for determining the information bit sequence used for the multi-level decoding procedure of the receiver is the same as the rule for determining the information bit sequence used for the multi-level encoding procedure of the transmitter. As shown in FIG. 26, if the transmitter performs encoding for the second information bit sequence ($a_p$) and transmits the encoded data, the receiver reads out the part $a_p'$ corresponding to the second information bit sequence of the part a' stored in the memory. Also, if the transmitter performs encoding for the third information bit sequence ($a_{p1}$) and transmits the encoded data, the receiver reads out the part $a_{p1}'$ corresponding to the third information bit sequence of the part a' stored in the memory.

The four methods shown in FIG. 26 can be determined in accordance with the parity check matrix. In other words, if decoding is performed using the first parity check matrix, the distorted information bit is selected in accordance with the method of FIG. 26A to perform decoding. Also, if decoding is performed using the second parity check matrix, the distorted information bit is selected in accordance with the method of FIG. 26B to perform decoding.

Although the parity check matrixes used for decoding of the information bit sequence of FIGS. 26A, 26B, 26C and 26D may be different from one another, since the transmitter and the receiver know the position of the information bit sequence used for encoding and decoding, the receiver can perform decoding by using the retransmitted parity bits even though the transmitter retransmits only the parity bits without retransmitting the information bit sequence.

Figure 27:
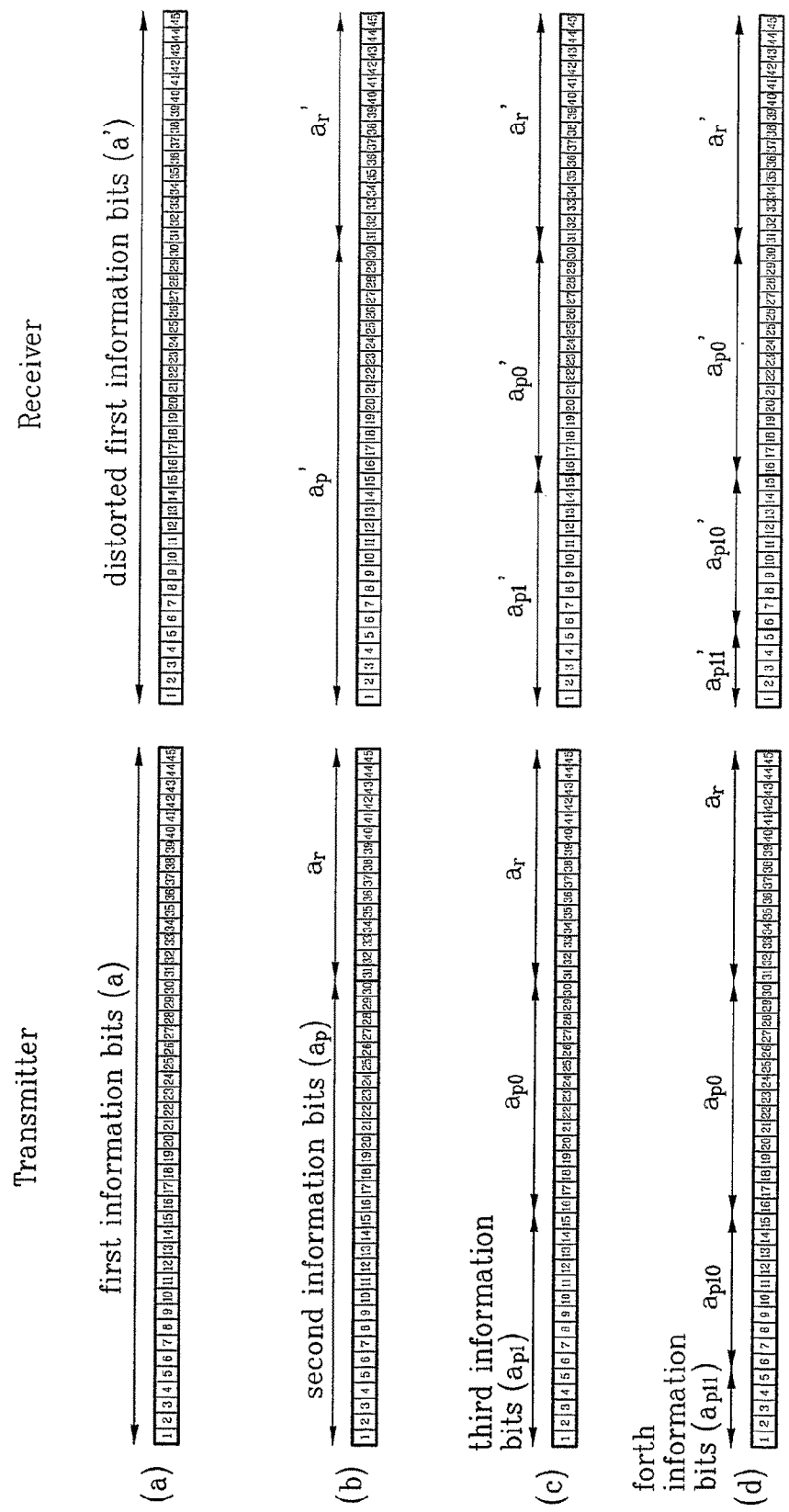
FIG. 27 illustrates another method of selecting information bit sequence used when encoding and decoding are performed in accordance with the embodiment of the present invention.

FIG. 27 illustrates another example of a method of selecting the information bit sequence used when encoding and decoding are performed in accordance with the embodiment of the present invention.

FIG. 27 illustrates another example of classifying the information bit sequence of 45 bits into four methods. In other words, if the receiver receives the entire part of 45 bits (a') and its corresponding first parity bits (not shown), the receiver decodes the part a' and the parity bits and transmits ACK/NACK. If NACK is transmitted, the receiver receives second parity bits (not shown) generated by the part $a_p$ of FIG. 27B and decodes the second parity bits and the part $a_p'$ of FIG. 27B.

Figure 28:
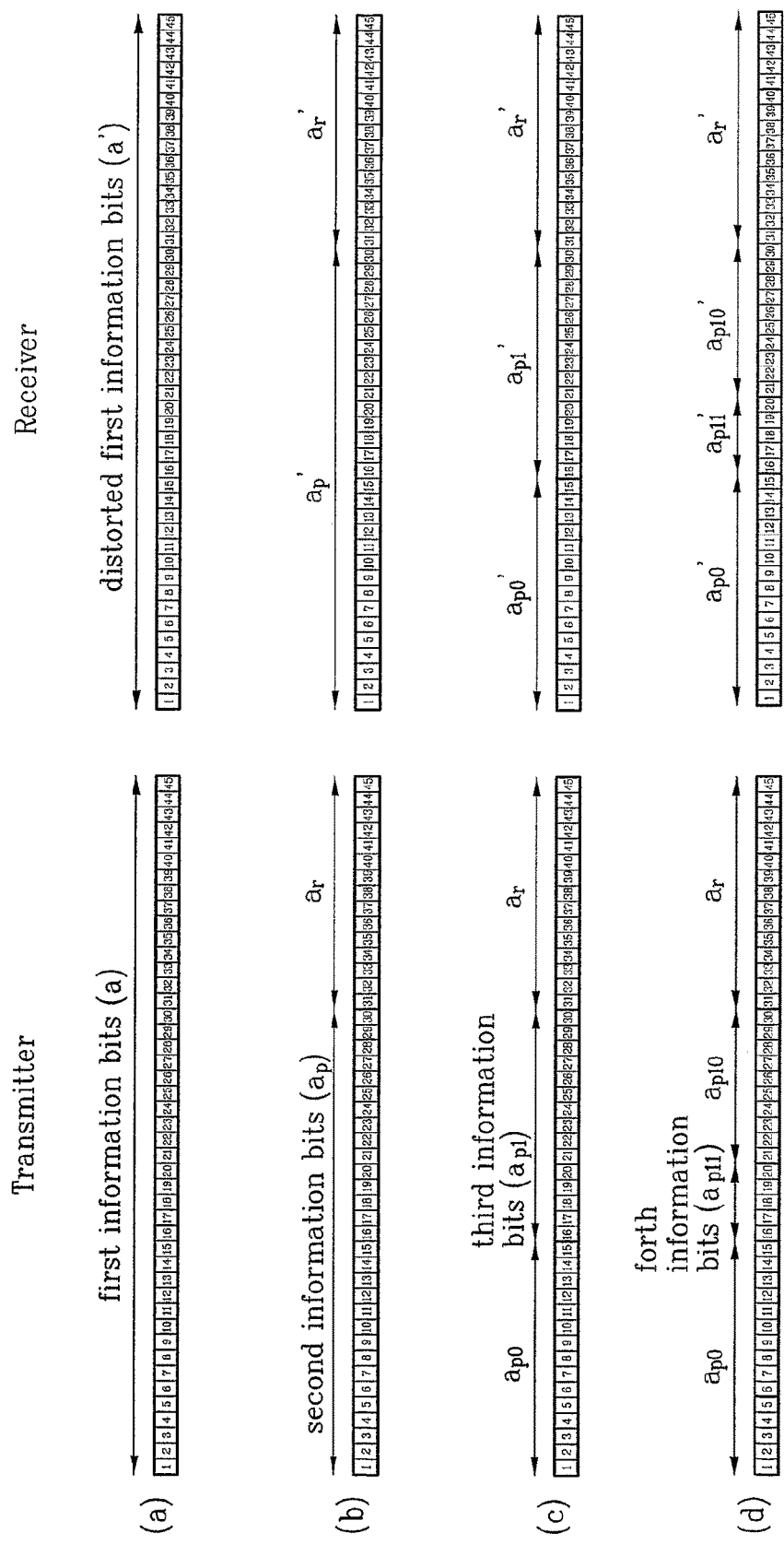
FIG. 28 illustrates other method of selecting information bit sequence used when encoding and decoding are performed in accordance with the embodiment of the present invention.

FIG. 28 illustrates another example of a method of selecting the information bit sequence used when encoding and decoding are performed in accordance with the embodiment of the present invention.

Figure 29:
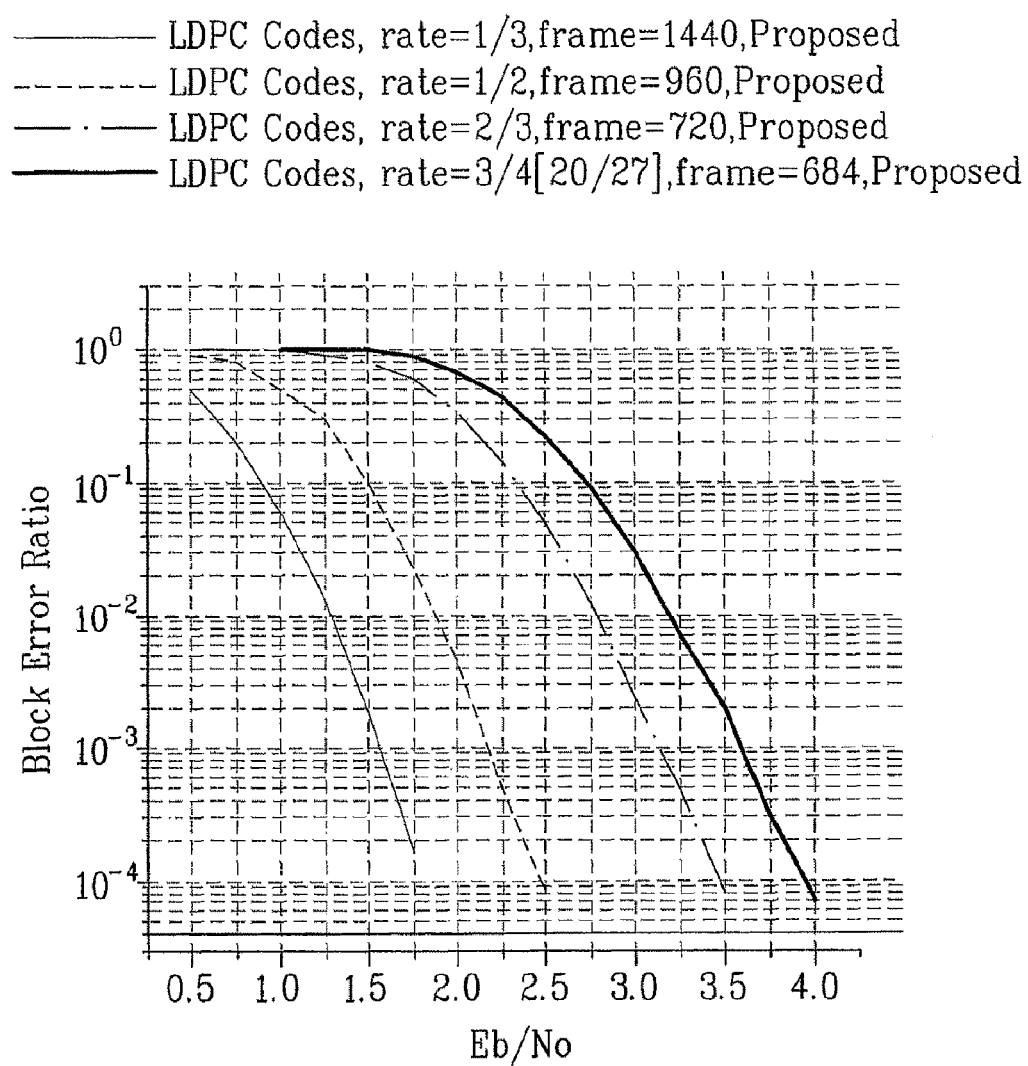
FIG. 29 illustrates a performance curve of an embodiment which supports various coding rates by using one mother matrix in accordance with the embodiment of the present invention.

In accordance with this embodiment, the receiver requests the transmitter of retransmission, and performs decoding by using information bit sequence different from that of the related art. Since FIG. 28 to FIG. 30 are only exemplary to describe various methods of selecting the information bit sequence in accordance with this embodiment, the present invention is not limited to numerical values of FIG. 28 to FIG. 30.

In the examples of FIG. 25A to FIG. 25C, decoding is performed in accordance with four parity check matrixes. In the examples of FIG. 26 to FIG. 28, the received bit is selected in accordance with the four parity check matrixes. The four parity check matrixes could be different parity check matrixes from one another. In other words, even though the features of the four parity check matrixes are different from one another, the decoding method according to this embodiment can be used. However, it is preferable that a plurality of parity check matrixes used in this embodiment correspond to a plurality of coding rates. Referring to the examples of FIG. 25A to FIG. 25C, decoding is performed using the first matrix to the fourth matrix. The first matrix corresponds to a specific first coding rate, the second matrix corresponds to a specific second coding rate, the third matrix corresponds to a specific third coding rate, and the fourth matrix corresponds to a specific fourth coding rate.

If the first coding rate is the highest, the second coding rate is the second highest, the third coding rate is the third highest, and the fourth coding rate is the lowest, the decoding method according to this embodiment can be applied to the IR method.

In other words, the receiver performs decoding, and transmits NACK to the transmitter if decoding is failed. Afterwards, the transmitter retransmits the parity bits only without transmitting the information bit sequence. If retransmission is performed, the transmitter changes the first coding rate (for example, 3/4) to the second coding rate (for example, 2/3) to allow the receiver to perform decoding well. The receiver performs decoding by using the second matrix. If decoding is failed, the receiver can transmit NACK to the transmitter to request encoding of a lower coding rate (the third coding rate or the fourth coding rate). Also, if decoding is successfully performed as the receiver receives parity bits corresponding to the second coding rate, the procedure A of FIG. 25A is performed to decode the codeword corresponding to the first coding rate. In short, the receiver decodes the codeword corresponding to the higher coding rate if decoding is successfully performed, and decodes the codeword corresponding to the lower coding rate if decoding is failed.

The decoding method according to this embodiment can be based on the structured LDPC code. As described above, the structured LDPC code represents the parity check matrix by using the sub-block of a specific size (for example, z*z). In other words, the parity check matrix is expanded from a specific model matrix. In this embodiment, various information bit sequences are selected to perform decoding. If the size (z factor) of the sub-block is variable, it is advantageous in that decoding can be performed for the information bits of various sizes.

FIG. 29 illustrates a performance curve which supports various coding rates by using one mother matrix. As shown in FIG. 29, the encoding method according to the present invention has performance similar to or more excellent than performance the related art various encoding methods. Considering that the encoding method according to the present invention uses a smaller memory, it is noted that the present invention shows more excellent performance than performance of low density parity check code of the existing IEEE 802.16e.

The aforementioned coding rates, the sizes of the matrixes, and weight features are only exemplary to describe the present invention, and the present invention is not limited to the aforementioned numerical values. In other words, the above conditions such as the coding rates may freely be changed.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

Industrial Applicability

The present invention can be applied to every field where encoding and decoding are used, as well as a wireless communication system such as a mobile communication system or a wireless Internet system.

The invention claimed is:

1. A method of transmitting, by a transmitter, data in a communication system, the method comprising:
encoding an information bit sequence by using a first parity check matrix, consisting of a first systematic part and a first parity part, to generate a first codeword comprised of the information bit sequence and a first parity bit sequence;
transmitting the first codeword to a receiver;
receiving a negative reception acknowledgement (NACK) from the receiver in response to the first codeword;
encoding at least a part of the information bit sequence by using a second parity check matrix, consisting of a second systematic part and a second parity part, to generate a second codeword comprised of the part of the information bit sequence and a second parity bit sequence; and
transmitting the second parity bit sequence to the receiver, and not transmitting the part of the information bit sequence of the second codeword,
wherein the first parity check matrix is corresponding to a first coding rate, and the second parity check matrix is corresponding to a second coding rate different from the first coding rate, and
wherein each of the first and second parity check matrixes consists of sub-blocks each of which is a z-by-z zero matrix, a z-by-z identity matrix, or a z-by-z permutation matrix generated by shifting each row of the z-by-z identity matrix by a shift number.

2. The method of claim 1, wherein the second coding rate is lower than the first coding rate.

3. The method of claim 1, wherein the second parity check matrix includes the first parity check matrix.

4. The method of claim 3, wherein the encoding at least a part of the information bit sequence includes performing encoding calculation by using only additional region of the second parity check matrix when compared with the first parity check matrix.

5. The method of claim 1, wherein the first parity check matrix includes the second parity check matrix.

6. The method of claim 1, wherein, if the first and second parity check matrixes are in a form of a model matrix of which each element is '−1' representing the z-by-z zero matrix, '0' representing the z-by-z identity matrix, or 'positive integer' corresponding to the shift number and representing the z-by-z permutation matrix, each of the encoding operations include:
expanding the model matrix into the first or second parity check matrix in accordance with each index.

7. The method of claim 1, wherein each of the first and second parity check matrixes is a part of a model matrix of which each element is '−1' representing the z-by-z zero matrix, '0' representing the z-by-z identity matrix, or 'positive integer' corresponding to the shift number and representing the z-by-z permutation matrix.

8. The method of claim 7, wherein the second parity check matrix includes the first parity check matrix.

9. The method of claim 8, wherein each of the first and second parity parts is a lower triangle type matrix in which each sub-block on a main diagonal and an adjacent diagonal located lower than the main diagonal is a z-by-z matrix other than the z-by-z zero matrix, and
wherein each sub-block above the main diagonal and below the adjacent diagonal, except for one or more sub-blocks located on a leftmost column of each of the first and second parity parts, is the z-by-z zero matrix.

10. The method of claim 7, wherein a lowermost leftmost sub-block of a parity part of the model matrix is a positive integer.

11. The method of claim 1, wherein the part of the information bit sequence is a region previously set for the information bit sequence.

12. The method of claim 1, wherein the first parity check matrix and the second parity check matrix are separate from each other.

13. A method of receiving, by a receiver, data in a communication system, the method comprising:
receiving a first codeword comprised of an information bit sequence and a first parity bit sequence from a transmitter;
decoding the first codeword by using a first parity check matrix, the first parity check matrix consisting of a first systematic part and a first parity part;
transmitting a negative reception acknowledgement (NACK) to the receiver in response to the first codeword;
receiving a parity bit sequence of a second codeword from the transmitter, and not receiving another information bit sequence of the second codeword,
decoding the second codeword, which is obtained by combining a part of the information bit sequence with the second parity bit sequence, by using a second parity check matrix, the second parity check matrix consisting of a second systematic part and a second parity part,
wherein the first parity check matrix is corresponding to a first coding rate, and the second parity check matrix is corresponding to a second coding rate different from the first coding rate, and
wherein each of the first and second parity check matrixes consists of sub-blocks each of which is a z-by-z zero matrix, a z-by-z identity matrix, or a z-by-z permutation matrix generated by shifting each row of the z-by-z identity matrix as much as a shift number.

14. The method of claim 13, further comprising:
if the decoding by the second parity check matrix is successfully performed, decoding a corrected first codeword by using the first parity check matrix,
wherein the corrected first codeword is comprised of a remaining part of the information bit sequence other than the part of the information bit sequence, a corrected part of the information bit sequence to which the part of the information bit sequence is corrected through the decoding by the second parity check matrix, and the first parity bit sequence.

15. The method of claim 13, wherein the second coding rate is lower than the first coding rate.

16. The method of claim 15, wherein the second parity check matrix includes the first parity check matrix.

17. The method of claim 15, wherein each of the first and second parity parts is a lower triangle type matrix in which each sub-block on a main diagonal and an adjacent diagonal located lower than the main diagonal is a z-by-z matrix other than the z-by-z zero matrix, and
wherein each sub-block above the main diagonal and below the adjacent diagonal, except for one or more sub-blocks located on a leftmost column of each of the first and second parity parts, is the z-by-z zero matrix.

18. The method of claim 13, wherein the first parity check matrix and the second parity check matrix are separate from each other.

19. A transmitter of transmitting data in a communication system, the transmitter comprising:
- an encoder configured to encode an information bit sequence by using a first parity check matrix, consisting of a first systematic part and a first parity part, to generate a first codeword, the first codeword comprised of the information bit sequence and a first parity bit sequence; and
- one or more antennas configured to transmit the first codeword to a receiver,
- wherein if the one or more antennas receive a negative reception acknowledgement (NACK) from the receiver in response to the first codeword, the encoder encodes at least a part of the information bit sequence by using a second parity check matrix, consisting of a second systematic part and a second parity part, to generate a second codeword, the second codeword comprised of the part of the information bit sequence and a second parity bit sequence; and the one or more antennas transmits the second parity bit sequence to the receiver and do not transmit the part of the information bit sequence of second codeword,
- wherein the first parity check matrix is corresponding to a first coding rate, and the second parity check matrix is corresponding to a second coding rate different from the first coding rate, and
- wherein each of the first and second parity check matrixes consists of sub-blocks each of which is a z-by-z zero matrix, a z-by-z identity matrix or a z-by-z permutation matrix generated by shifting each row of the z-by-z identity matrix as much as a shift number.

20. A receiver of receiving data in a communication system, the receiver comprising:
- one or more antennas configured to receiving a first codeword comprised of an information bit sequence and a first parity bit sequence from a transmitter; and
- a decoder configured to decode the first codeword by using a first parity check matrix, the first parity check matrix consisting of a first systematic part and a first parity part,
- wherein the one or more antennas transmit a negative reception acknowledgement (NACK) to the receiver in response to the first codeword and receive a second parity bit sequence of a second codeword from the transmitter in response to the NACK; and the decoder decodes the second codeword, which is obtained by combining a part of the information bit sequence with the second parity bit sequence, by using a second parity check matrix, the second parity check matrix consisting of a second systematic part and a second parity part,
- wherein the first parity check matrix is corresponding to a first coding rate, and the second parity check matrix is corresponding to a second coding rate different from the first coding rate, and
- wherein each of the first and second parity check matrixes consists of sub-blocks each of which is a z-by-z zero matrix, a z-by-z identity matrix or a z-by-z permutation matrix generated by shifting each row of the z-by-z identity matrix as much as a shift number.

\* \* \* \* \*